(12) United States Patent
Jung et al.

(10) Patent No.: US 12,733,376 B2
(45) Date of Patent: Sep. 8, 2026

(54) DISPLAY DEVICE

(71) Applicant: Samsung Display Co., Ltd., Yongin-Si (KR)

(72) Inventors: Eunae Jung, Yongin-si (KR); Eunhye Kim, Yongin-si (KR); Kiho Bang, Yongin-si (KR); Inhyuck Yeo, Yongin-si (KR); Wonsuk Choi, Yongin-si (KR)

(73) Assignee: Samsung Display Co., Ltd., Yongin-Si (KR)

( * ) Notice: Subject to any disclaimer, the term of this patent is extended or adjusted under 35 U.S.C. 154(b) by 634 days.

(21) Appl. No.: 18/123,985

(22) Filed: Mar. 21, 2023

(65) Prior Publication Data

US 2024/0008345 A1 Jan. 4, 2024

(30) Foreign Application Priority Data

Jun. 29, 2022 (KR) ........................ 10-2022-0079989

(51) Int. Cl.
*H10K 59/80* (2023.01)
*H10K 59/122* (2023.01)
*H10K 59/40* (2023.01)

(52) U.S. Cl.
CPC ......... *H10K 59/873* (2023.02); *H10K 59/122* (2023.02); *H10K 59/40* (2023.02)

(58) Field of Classification Search
CPC ..... H10K 59/122; H10K 59/40; H10K 59/873
See application file for complete search history.

(56) References Cited

U.S. PATENT DOCUMENTS

| | | | | |
|---|---|---|---|---|
| 9,373,813 | B2 | 6/2016 | Oh et al. | |
| 10,727,434 | B2 | 7/2020 | Kwon et al. | |
| 10,978,671 | B2 * | 4/2021 | Gong | H10K 50/844 |
| 11,004,915 | B2 | 5/2021 | Byun et al. | |
| 2019/0207157 | A1 * | 7/2019 | Gong | H10K 50/844 |
| 2021/0126057 | A1 * | 4/2021 | Seo | G06F 3/0446 |
| 2021/0399262 | A1 * | 12/2021 | Woo | G09G 3/3208 |
| 2022/0020833 | A1 | 1/2022 | Cho et al. | |

FOREIGN PATENT DOCUMENTS

| | | | |
|---|---|---|---|
| KR | 10-1470383 | B1 | 12/2014 |
| KR | 10-2018-0011924 | A | 2/2018 |
| KR | 10-2019-0004407 | A | 1/2019 |
| KR | 10-2019-0081005 | A | 7/2019 |
| KR | 10-1996436 | B1 | 7/2019 |
| KR | 10-2021-0049245 | A | 5/2021 |
| KR | 10-2021-0157947 | A | 12/2021 |
| KR | 10-2022-0010690 | A | 1/2022 |

* cited by examiner

*Primary Examiner* — Shaun M Campbell
(74) *Attorney, Agent, or Firm* — Innovation Counsel LLP

(57) ABSTRACT

Provided is a display device including a substrate, a display portion on the substrate, and a thin-film encapsulation layer configured to shield the display portion and including an organic encapsulation layer, wherein the display portion includes a valley portion configured to control a flow of the organic encapsulation layer, and the valley portion includes a valley overlapping the organic encapsulation layer, a valley peak of which at least a portion is higher than a lower surface of the valley, and at least one control hole configured to control a position of an end of the organic encapsulation layer such that the end of the organic encapsulation layer is disposed on the valley peak.

17 Claims, 19 Drawing Sheets

DISPLAY DEVICE

CROSS-REFERENCE TO RELATED APPLICATION

This application is based on and claims priority under 35 U.S.C. § 119 to Korean Patent Application No. 10-2022-0079989, filed on Jun. 29, 2022, in the Korean Intellectual Property Office, the disclosure of which is incorporated by reference herein in its entirety.

BACKGROUND

1. Field

One or more embodiments relate to a display device, and more particularly, to a display device including various organic layers and capable of preventing from overflowing by adjusting the heights of a valley and a valley peak.

2. Description of the Related Art

Electronic devices based on mobility have been widely used. In addition to small electronic devices such as mobile phones, tablet personal computers (PCs) have been widely used as mobile electronic devices in recent times.

Such mobile electronic devices include display devices that support various functions and provide a user with visual information, such as images or videos. Recently, as other components for driving a display device have been miniaturized, the proportion of a display device in an electronic device has gradually increased, and a structure that can be bent from a flat state to have a certain angle has been developed.

SUMMARY

Generally, a display device may include various organic layers. In a case where an upper organic layer from among the various organic layers, which is arranged in an upper portion of the display device, has an upper surface that is not flat, a stripe may be visible when the display device is not in operation, or an image may appear distorted when the display device is in operation. One or more embodiments include a display device including a uniform organic layer.

Additional aspects will be set forth in part in the description which follows and, in part, will be apparent from the description, or may be learned by practice of the presented embodiments of the disclosure.

According to one or more embodiments, a display device includes a substrate, a display portion on the substrate, and a thin-film encapsulation layer configured to shield the display portion and including an organic encapsulation layer, wherein the display portion includes a valley portion configured to control a flow of the organic encapsulation layer, and the valley portion includes a valley overlapping the organic encapsulation layer, a valley peak of which at least a portion is higher than a lower surface of the valley, and at least one control hole configured to control a position of an end of the organic encapsulation layer such that the end of the organic encapsulation layer is disposed on the valley peak.

In the present embodiment, the valley peak may include a first valley peak and a second valley peak of which at least a portion is formed to be higher than the first valley peak.

In the present embodiment, the at least one control hole may be arranged in the first valley peak.

In the present embodiment, the second valley peak may include a peak surface including an uneven shape along a boundary with the first valley peak.

In the present embodiment, the peak surface may include at least one sawtooth shape when viewed from above.

In the present embodiment, at least a portion of the at least one control hole may be arranged in an area between edges of two adjacent sawtooth shapes of the at least one sawtooth shape.

In the present embodiment, a plurality of the control hole may be provided, and in a plan view, the plurality of control holes may be spaced apart from each other in at least one of a first direction and a second direction.

In the present embodiment, the first direction and the second direction may not be perpendicular to each other.

In the present embodiment, the display portion may include a first insulating layer on the substrate, a second insulating layer on the first insulating layer, and a pixel-defining layer on the second insulating layer, the pixel-defining layer may be arranged in the valley, and the second insulating layer and the pixel-defining layer may be arranged in the valley peak.

In the present embodiment, the second insulating layer may be further arranged in the valley.

In the present embodiment, a spacer may be arranged in the second valley peak.

In the present embodiment, the display portion may include a second insulating layer and a pixel-defining layer on the second insulating layer, and the at least one control hole may penetrate at least a portion of at least one of the second insulating layer and the pixel-defining layer.

According to one or more embodiments, a display device includes a substrate including a display area and a non-display area, a first insulating layer on the substrate, a second insulating layer on the first insulating layer, a pixel-defining layer on the second insulating layer, and a thin-film encapsulation layer covering the pixel-defining layer and including an organic encapsulation layer, wherein a portion of at least one of the second insulating layer and the pixel-defining layer may be recessed to accommodate the organic encapsulation layer, the second insulating layer and the pixel-defining layer being arranged in the non-display area, at least one control hole may be arranged in another portion of at least one of the second insulating layer and the pixel-defining layer, the other portion being higher than the recessed portion of at least one of the second insulating layer and the pixel-defining layer, and the at least one control hole may be configured to control a position of an end of the organic encapsulation layer.

In the present embodiment, a planar shape of one control hole of the at least one control hole and a planar shape of another one control hole of the at least one control hole may be different from each other.

In the present embodiment, a cross-sectional shape of one control hole of the at least one control hole and a cross-sectional shape of another one control hole of the at least one control hole may be different from each other.

In the present embodiment, a planar shape of the at least one control hole may include one of a polygon, a circle, and an oval.

In the present embodiment, a side surface of a cross-sectional shape of the at least one control hole may be inclined.

In the present embodiment, a side surface of a cross-sectional shape of the at least one control hole may be stepped.

In the present embodiment, the at least one control hole may be formed in different layers in a depth direction.

In the present embodiment, a plurality of the control hole may be provided, and in a plan view, the plurality of control holes may be spaced apart from each other in a first direction and a second direction.

Other aspects, features, and advantages than those described above will become apparent from the following drawings, claims, and detailed description of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
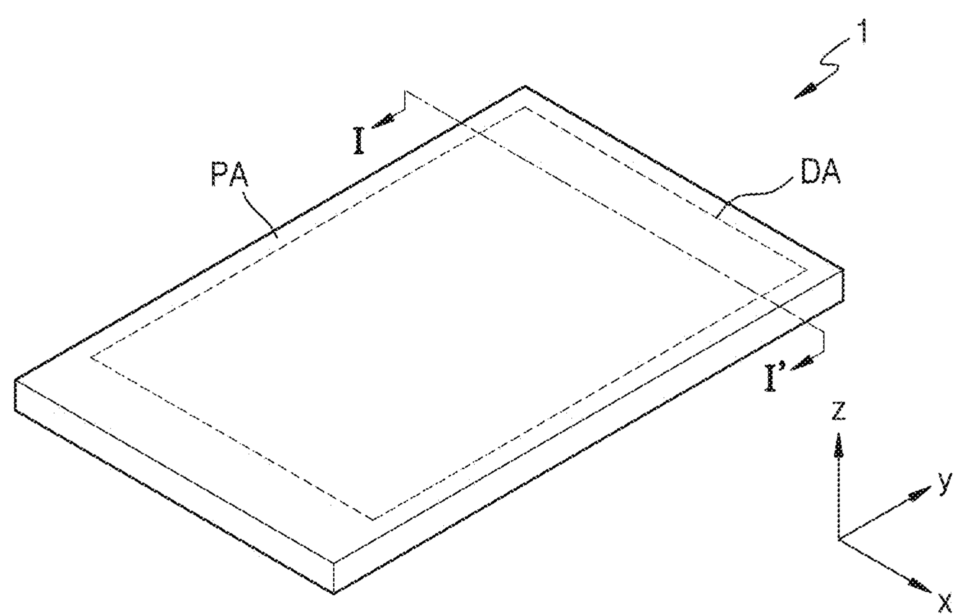
FIG. 1 is a perspective view schematically illustrating a display device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the disclosure allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

Hereinafter, embodiments of the disclosure will be described in detail with reference to the accompanying drawings, wherein the same or corresponding components are denoted by the same reference numerals throughout and repeated descriptions thereof are omitted.

It will be understood that although the terms "first," "second," etc. may be used herein to describe various components, these components should not be limited by these terms. These terms are only used to distinguish one component from another.

An expression used in the singular encompasses an expression of the plural unless the context expressly indicates otherwise.

It will be understood that the terms "comprise," "comprising," "include" and/or "including" as used herein specify the presence of stated features or components but do not preclude the addition of one or more other features or components.

It will be understood that when a layer, region, or component is referred to as being formed on another layer, region, or component, it can be directly or indirectly formed on the other layer, region, or component. That is, for example, intervening layers, regions, or components may be present.

In the drawings, sizes of components may be exaggerated or reduced for convenience of description. For example, because sizes and thicknesses of components in the drawings are arbitrarily illustrated for convenience of description, the disclosure is not limited thereto.

The x-axis, the y-axis, and the z-axis are not limited to three axes of the rectangular coordinate system and may be interpreted in a broader sense. For example, the x-axis, the y-axis, and the z-axis may be perpendicular to one another, or may represent different directions that are not perpendicular to one another.

When a certain embodiment may be implemented differently, a specific process order may be performed differently from the described order. For example, two processes described in succession may be performed substantially simultaneously, or may be performed in an order opposite to the described order.

Figure 2:
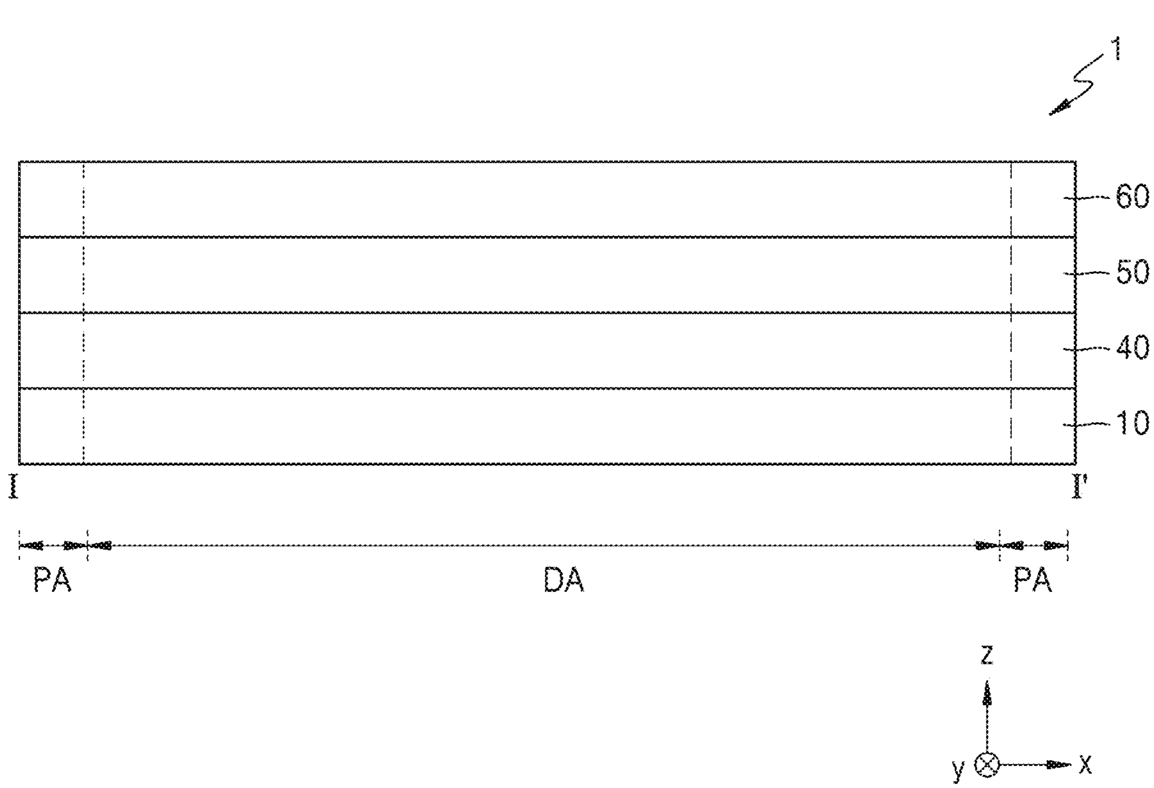
FIG. 2 is a cross-sectional view schematically illustrating a display device taken along line I-I' of FIG. 1 according to an embodiment.

FIG. 1 is a perspective view schematically illustrating a display device 1 according to an embodiment. FIG. 2 is a cross-sectional view schematically illustrating the display device 1 according to an embodiment, taken along line I-I' of FIG. 1.

Referring to FIGS. 1 and 2, the display device 1 according to embodiments may be implemented as an electronic device, such as a smartphone, a mobile phone, a smart watch, a navigation device, a game console, a television (TV), a vehicle head unit, a notebook computer, a laptop computer, a tablet computer, a personal media player (PMP), or a personal digital assistant (PDA). In addition, the electronic device 1 may be a flexible device.

The display device 1 may include a display area DA in which an image is displayed and a peripheral area PA arranged around the display area DA. The display device 1 may provide a certain image by using light emitted from a plurality of pixels arranged in the display area DA.

The display device 1 may have various shapes, for example, a rectangular plate shape with two pairs of sides that are parallel to each other. When the display device 1 has a rectangular plate shape, one pair of sides from among the two pairs of sides may be longer than the other pair of sides. In an embodiment, for convenience of description, a case where the display device 1 has a rectangular shape with a pair of long sides and a pair of short sides is described, wherein an extension direction of the short sides is indicated as a x-direction, an extension direction of the long sides is indicated as a y-direction, and a direction perpendicular to the extension directions of the long sides and the short sides is indicated as a z-direction. In another embodiment, the display device 1 may have a non-quadrangular shape. The non-quadrangular shape may be, for example, a circle, an oval, a partially circular polygon, or a polygon other than a quadrangle.

In a plan view, the display area DA may have a rectangular shape as shown in FIG. 1. In another embodiment, the display area DA may have a polygonal shape, such as a triangle, a pentagon, or a hexagon, or may have a circular shape, an oval shape, or an irregular shape.

The peripheral area PA is arranged around the display area DA, and may be a type of non-display area in which pixels are not arranged. The display area DA may be entirely surrounded by the peripheral area PA. Various wirings configured to transmit electrical signals to the display area DA and pads to which a printed circuit board or a driver integrated circuit (IC) chip is attached may be arranged in the peripheral area PA.

Hereinafter, an organic light-emitting display device is described as an example of the display device 1 according to an embodiment, but the display device 1 of the disclosure is not limited thereto. In another embodiment, the display device 1 of the disclosure may be a display device such as an inorganic light-emitting display device (or an inorganic electroluminescent (EL) display device) or a quantum dot light-emitting display device.

Referring to FIG. 2, the display device 1 may include a display panel 10, an input sensing layer 40 disposed on the display panel 10, an optical functional layer 50 disposed on the sending layer 40, and a cover window 60 disposed on the optical functional layer.

The display panel 10 may display an image. The display panel 10 includes pixels arranged in the display area DA. The pixels may include a display element. The display element may be connected to a pixel circuit. The display element may include an organic light-emitting diode or a quantum dot organic light-emitting diode.

The input sensing layer 40 acquires coordinate information according to an external input, for example, a touch event. The input sensing layer 40 may include a sensing electrode (or a touch electrode) and trace lines connected to the sensing electrode. The input sensing layer 40 may be disposed on the display panel 10. The input sensing layer 40 may sense an external input by using a mutual capacitance method and/or a self-capacitance method.

The input sensing layer 40 may be directly formed on the display panel 10, or may be separately formed and then coupled to the display panel 10 through an adhesive layer, such as an optical clear adhesive. For example, the input sensing layer 40 may be continuously formed after a process of forming the display panel 10, and in this case, the input sensing layer 40 may be a portion of the display panel 10, and an adhesive layer may not be arranged between the input sensing layer 40 and the display panel 10. Although FIG. 2 illustrates that the input sensing layer 40 is arranged between the display panel 10 and the optical functional layer 50, in another embodiment, the input sensing layer 40 may be arranged over the optical functional layer 50.

The optical functional layer 50 may include a color conversion layer and an anti-reflection layer. The color conversion layer may convert light emitted from the display panel 10 into a certain wavelength band. In this case, the color conversion layer may include a quantum dot layer, a light-transmitting layer, and a bank layer. Here, the bank layer is a light-blocking layer, and may be in the form of resin including a dye or the like. The anti-reflection layer may reduce the reflectivity of light (external light) that is incident toward the display panel 10 from the outside. The anti-reflection layer may include a black matrix and color filters. The color filters may be arranged considering a color of light emitted from each of pixels of the display panel 10.

Figure 3:
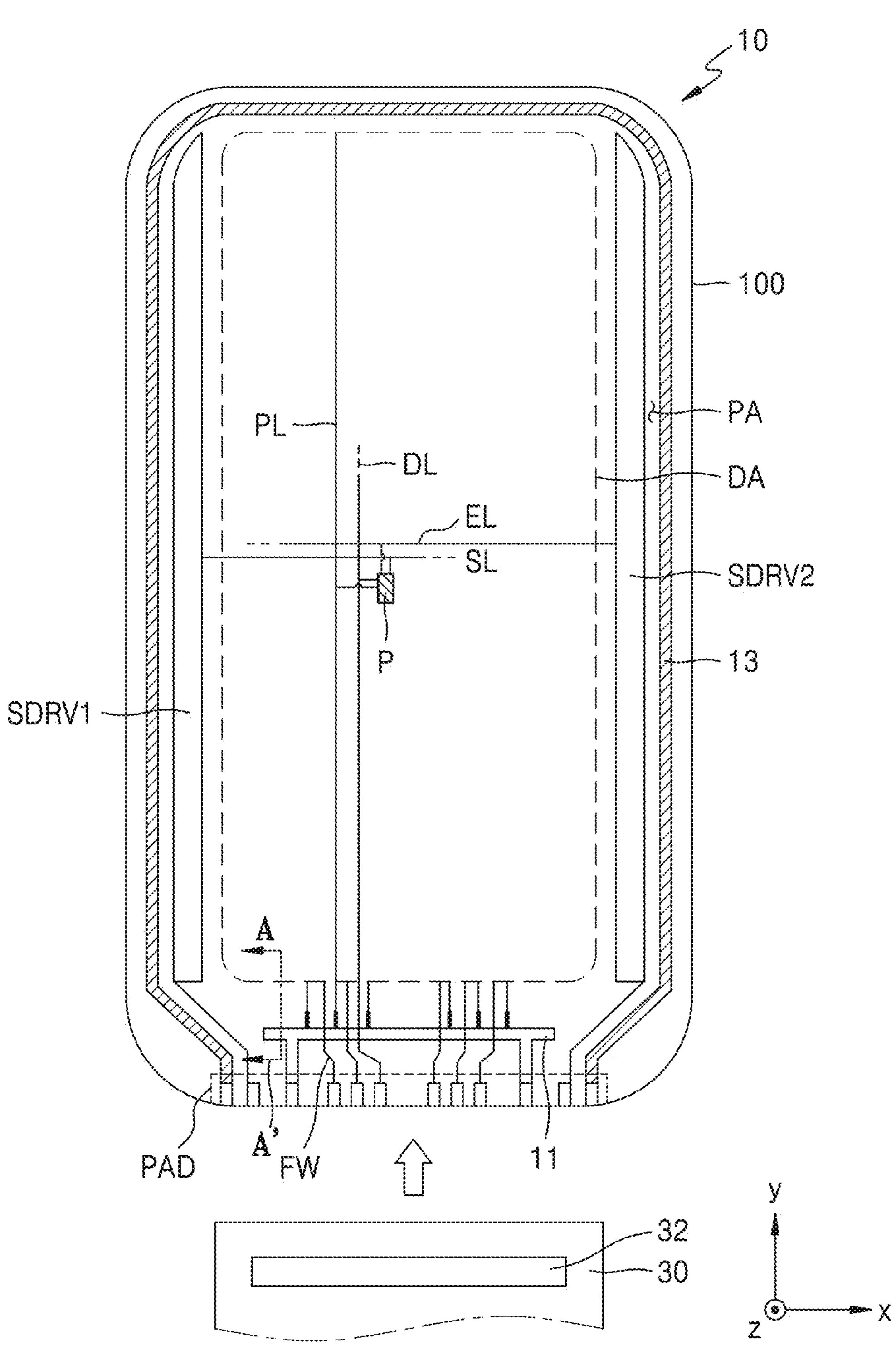
FIG. 3 is a plan view schematically illustrating a display panel according to an embodiment.

FIG. 3 is a plan view schematically illustrating the display panel 10 according to an embodiment.

Referring to FIG. 3, various components constituting the display panel 10 are disposed over a substrate 100. The substrate 100 includes the display area DA and the peripheral area PA surrounding the display area DA.

A plurality of pixels P and signal lines may be arranged in the display area DA, the signal lines being configured to apply an electrical signal to the pixels P. Each of the pixels P may be implemented as a display element, such as an organic light-emitting diode. Each pixel P may emit, for example, red, green, blue, or white light. The display area DA may be covered with an encapsulation member and protected from external air or moisture.

The signal lines that may apply an electrical signal to the plurality of pixels P may include a plurality of scan lines SL and a plurality of data lines DL. Each of the plurality of scan lines SL may extend in the x-direction, and each of the plurality of data lines DL may extend in the y-direction. The plurality of scan lines SL may be arranged, for example, in a plurality of rows to transmit a scan signal to the pixels P. The plurality of data lines DL may be arranged, for example, in a plurality of columns to transmit a data signal to the pixels P. Each of the plurality of pixels P may be connected to at least one scan line SL corresponding thereto from among the plurality of scan lines SL, and at least one data line DL corresponding thereto from among the plurality of data lines DL.

The signal lines may further include a plurality of driving voltage lines PL and a plurality of emission control lines EL. Each of the plurality of emission control lines EL may extend in the x-direction, and each of the plurality of driving voltage lines PL may extend in the y-direction. The plurality of emission control lines EL may be arranged, for example, in a plurality of rows to transmit an emission control signal to the pixels P. The plurality of driving voltage lines PL may be arranged, for example, in a plurality of columns to transmit a driving voltage signal (driving voltage) to the pixels P.

Each of pixel circuits that drive the pixels P may be electrically connected to outer circuits arranged in the peripheral area PA. The peripheral area PA is an area in which the pixels P are not arranged. Various electronic elements or a printed circuit board may be electrically attached to the peripheral area PA, and a voltage line configured to supply power to drive the pixels P may be arranged in the peripheral area PA. For example, a first scan driving circuit SDRV1, a second scan driving circuit SDRV2, a terminal portion PAD, and a power supply line may be arranged in the peripheral area PA. The power supply line may include a driving voltage supply line 11 and a common voltage supply line 13.

The first scan driving circuit SDRV1 may apply a scan signal to each of the pixel circuits that drive the pixels P through the scan lines SL. The second scan driving circuit SDRV2 may apply an emission control signal to each pixel circuit through the emission control lines EL. The second scan driving circuit SDRV2 may be arranged on the opposite side of the first scan driving circuit SDRV1 with the display area DA therebetween, and may be approximately parallel to the first scan driving circuit SDRV1.

The terminal portion PAD may be arranged on one side of the substrate 100. The terminal portion PAD is exposed without being covered by an insulating layer, and is connected to a display circuit board 30. A display driver 32 may be disposed on the display circuit board 30.

The display driver 32 may generate a control signal to be transmitted to the first scan driving circuit SDRV1 and the second scan driving circuit SDRV2. The display driver 32 may generate a data signal, and the generated data signal may be transmitted to the pixel circuits of the pixels P through fan-out lines FW and the data lines DL connected to the fan-out lines FW. The fan-out lines FW may extend in the y-direction.

The display driver 32 may supply a driving voltage ELVDD (see FIG. 4) to the driving voltage supply line 11, and may supply a common voltage ELVSS (see FIG. 4) to the common voltage supply line 13. The driving voltage ELVDD may be applied to the pixel circuits of the pixels P through the driving voltage line PL connected to the driving voltage supply line 11. The common voltage ELVSS may be applied to opposite electrodes of display elements through the common voltage supply line 13.

The driving voltage supply line 11 may be connected to the terminal portion PAD, and may extend in the x-direction from the lower side of the display area DA. The common voltage supply line 13 may be connected to the terminal portion PAD, may have a loop shape in which one side (e.g., the lower side of the display area DA) is open, and may partially surround the display area DA. The common voltage supply line 13 may extend in the y-direction from the left and right sides of the display area DA, and may extend in the x-direction from the upper side of the display area DA.

Figure 4:
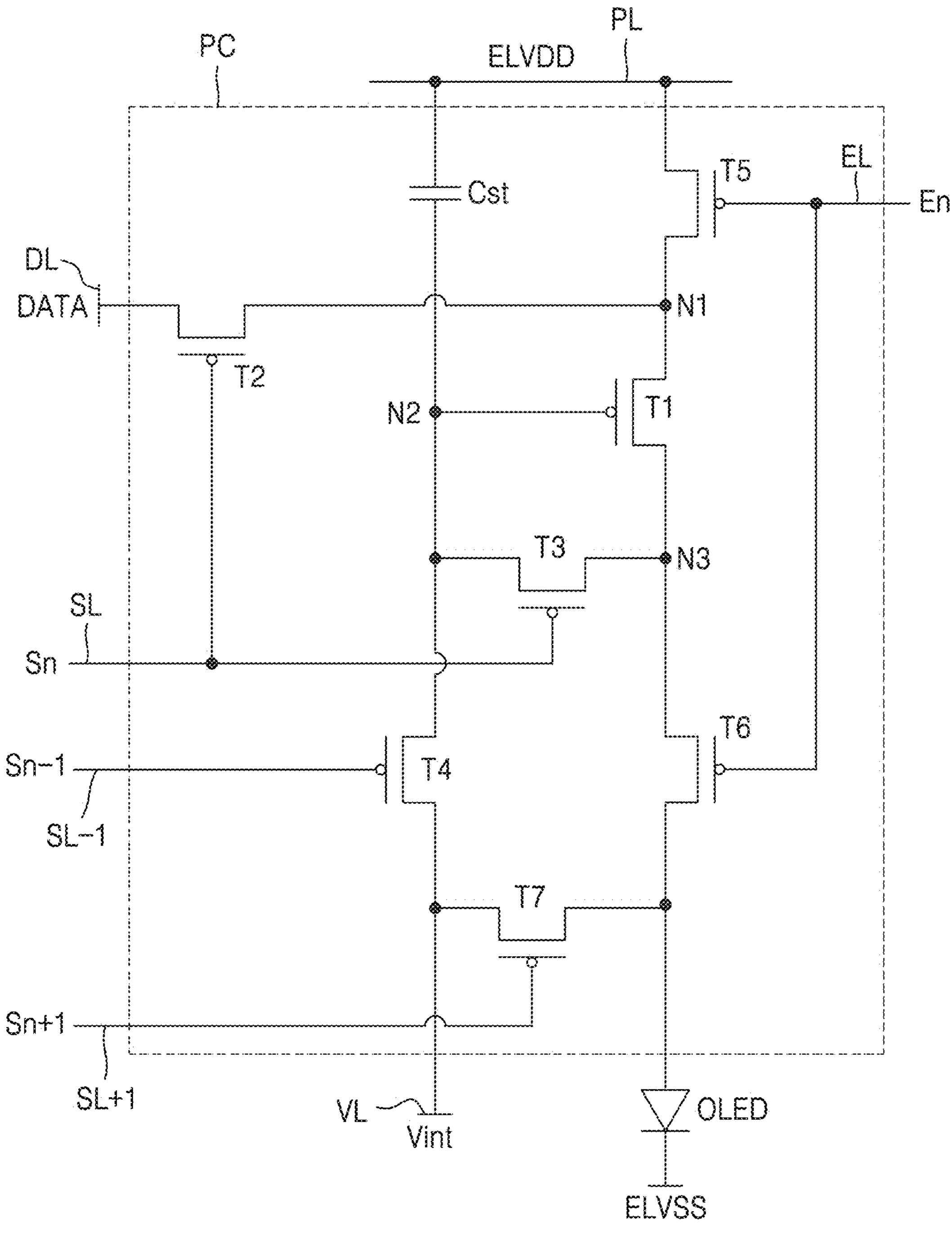
FIG. 4 is an equivalent circuit diagram illustrating a pixel according to an embodiment.

FIG. 4 is an equivalent circuit diagram illustrating a pixel according to an embodiment.

Referring to FIG. 4, a pixel circuit PC may include first to seventh transistors T1, T2, T3, T4, T5, T6, and T7, and according to a transistor type (p-type or n-type) and/or an operation condition, a first terminal of each of the first to seventh transistors T1, T2, T3, T4, T5, T6, and T7 may be a source terminal or a drain terminal, and a second terminal thereof may be a terminal different from the first terminal. For example, when the first terminal is a source terminal, the second terminal may be a drain terminal.

The pixel circuit PC may be connected to a first scan line SL configured to transmit a first scan signal Sn, a second scan line SL−1 configured to transmit a second scan signal Sn−1, a third scan line SL+1 configured to transmit a third scan signal Sn+1, the emission control line EL configured to transmit an emission control signal En, the data line DL configured to transmit a data signal DATA, the driving voltage line PL configured to transmit the driving voltage ELVDD, and an initialization voltage line VL configured to transmit an initialization voltage Vint.

The first transistor T1 includes a gate terminal connected to a second node N2, a first terminal connected to a first node N1, and a second terminal connected to a third node N3. The first transistor T1 serves as a driving transistor, and receives the data signal DATA according to a switching operation of the second transistor T2 to supply a driving current to a light-emitting element. The light-emitting element may be an organic light-emitting diode OLED.

The second transistor T2 (switching transistor) includes a gate terminal connected to the first scan line SL, a first terminal connected to the data line DL, and a second terminal connected to the first node N1 (or the first terminal of the first transistor T1). The second transistor T2 may be turned on according to the first scan signal Sn received through the first scan line SL to perform a switching operation of transmitting the data signal DATA transmitted to the data line DL, to the first node N1.

The third transistor T3 (compensation transistor) includes a gate terminal connected to the first scan line SL, a first terminal connected to the second node N2 (or the gate terminal of the first transistor T1), and a second terminal connected to the third node N3 (or the second terminal of the first transistor T1). The third transistor T3 may be turned on according to the first scan signal Sn received through the first scan line SL to diode-connect the first transistor T1. The third transistor T3 may have a structure in which two or more transistors are connected in series.

The fourth transistor T4 (first initialization transistor) includes a gate terminal connected to the second scan line SL−1, a first terminal connected to the initialization voltage line VL, and a second terminal connected to the second node N2. The fourth transistor T4 may be turned on according to the second scan signal Sn−1 received through the second scan line SL−1 to initialize a gate voltage of the first transistor T1 by transmitting the initialization voltage Vint to the gate terminal of the first transistor T1. The fourth transistor T4 may have a structure in which two or more transistors are connected in series.

The fifth transistor T5 (first emission control transistor) includes a gate terminal connected to the emission control line EL, a first terminal connected to the driving voltage line PL, and a second terminal connected to the first node N1. The sixth transistor T6 (second emission control transistor) includes a gate terminal connected to the emission control line EL, a first terminal connected to the third node N3, and a second terminal connected to a pixel electrode of the organic light-emitting diode OLED. The fifth transistor T5 and the sixth transistor T6 are simultaneously turned on according to the emission control signal En received through the emission control line EL, and thus, a current flows in the organic light-emitting diode OLED.

The seventh transistor T7 (second initialization transistor) includes a gate terminal connected to the third scan line SL+1, a first terminal connected to the second terminal of the sixth transistor T6 and the pixel electrode of the organic light-emitting diode OLED, and a second terminal connected to the initialization voltage line VL. The seventh transistor T7 may be turned on according to the third scan signal Sn+1 received through the third scan line SL+1 to initialize a voltage of the pixel electrode of the organic light-emitting diode OLED by transmitting the initialization voltage Vint to the pixel electrode of the organic light-emitting diode OLED. The seventh transistor T7 may be omitted.

A capacitor Cst includes a first electrode connected to the second node N2 and a second electrode connected to the driving voltage line PL.

The organic light-emitting diode OLED may include the pixel electrode and an opposing electrode facing the pixel electrode, and the opposing electrode may receive the common voltage ELVSS. The organic light-emitting diode OLED may receive a driving current from the first transistor T1 and emit light in a certain color to display an image. The counter electrode may be commonly provided, that is, integrally provided as a single body, to a plurality of pixels.

FIG. 4 illustrates a case where each of the fourth transistor T4 and the seventh transistor T7 is connected to the second scan line SL−1 and the third scan line SL+1, respectively, but the disclosure is not limited thereto. In another embodiment, both the fourth transistor T4 and the seventh transistor T7 may be connected to the second scan line SL−1 to be driven according to the second scan signal Sn−1.

Figure 5:
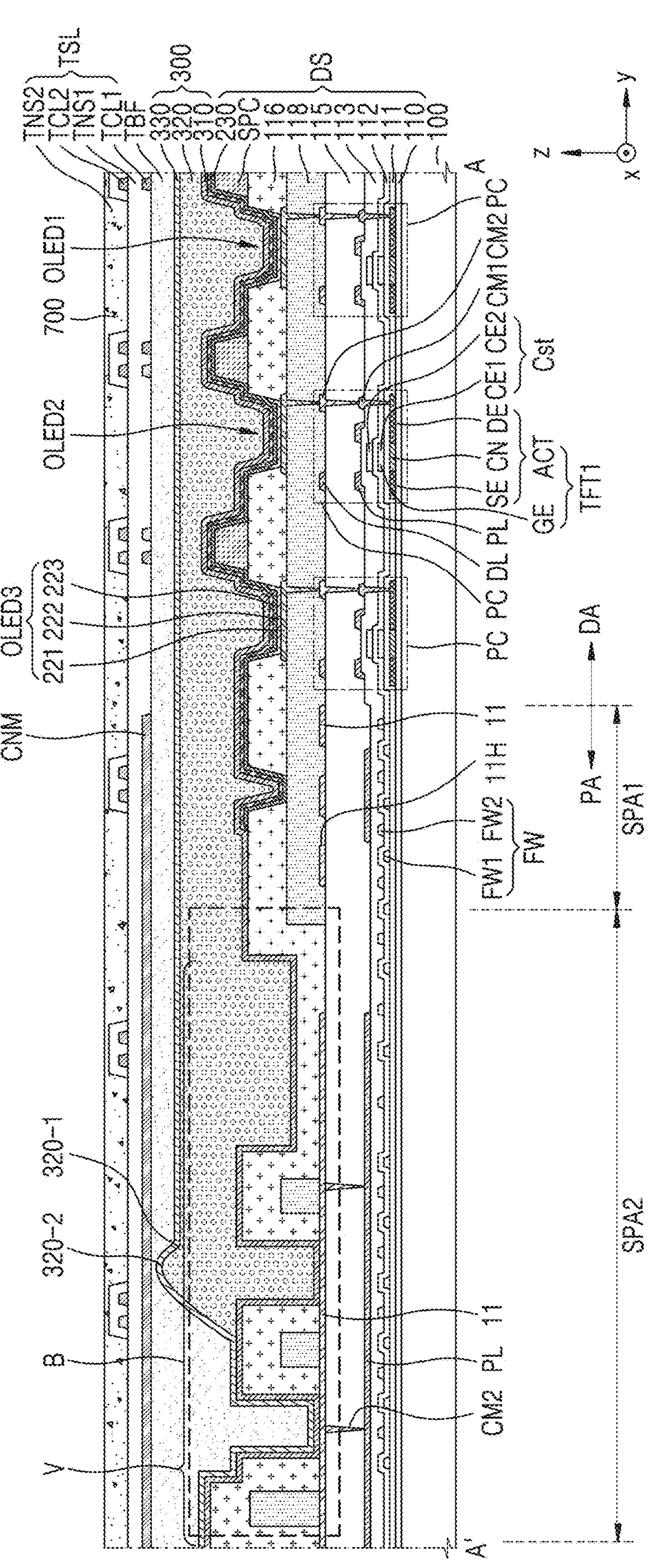
FIG. 5 is a cross-sectional view schematically illustrating a portion of a display device taken along line A-A' of FIG. 3 according to an embodiment.

FIG. 5 is a cross-sectional view schematically illustrating a portion of a display device taken along line A-A' of FIG. 3 according to an embodiment.

Referring to FIG. 5, when manufacturing the display panel 10, various layers may be sequentially formed on the substrate 100.

In detail, the pixel circuit PC and the organic light-emitting diode OLED electrically connected to the pixel circuit PC may be arranged in the display area DA of the substrate 100. The pixel circuit PC may include a first thin-film transistor TFT1 and the capacitor Cst.

The substrate 100 may include various materials, such as a metal material or a plastic material. In an embodiment, the substrate 100 may be a flexible substrate, and the substrate 100 may include a first base layer, a first barrier layer, a second base layer, and a second barrier layer that are sequentially stacked. Each of the first base layer and the second base layer may include a polymer resin. For example, each of the first base layer and the second base layer may include a polymer resin, such as polyethersulfone (PES), polyarylate (PAR), polyetherimide (PEI), polyethylene naphthalate (PEN), polyethylene terephthalate (PET), polyphenylene sulfide (PPS), polyimide (PI), polycarbonate, cellulose triacetate (TAC), or cellulose acetate propionate (CAP). The polymer resin may be transparent. Each of the first barrier layer and the second barrier layer may be a layer that prevents penetration of foreign substances, and may be a single layer or a multi-layer including an inorganic material, such as amorphous silicon, silicon nitride, and/or silicon oxide.

A display portion DS may be disposed on the substrate 100. The display portion DS may include a buffer layer 110, a first gate insulating layer 111, a second gate insulating layer 112, an interlayer insulating layer 113, a first insulating layer 115, a second insulating layer 118, a pixel-defining layer 116, a spacer SPC, and a capping layer 230.

The buffer layer 110 may be disposed on the substrate 100. The buffer layer 110 may block foreign substances or moisture penetrating through the substrate 100. The buffer layer 110 may include an inorganic material, such as silicon oxide, silicon nitride, and/or silicon oxynitride, and may be a single layer or a multi-layer.

The first thin-film transistor TFT1 may be one of the transistors described with reference to FIG. 4, for example, the first transistor T1 as a driving transistor. The first thin-film transistor TFT1 may include a semiconductor layer ACT, a gate electrode GE, a source electrode SE, and a drain electrode DE.

The semiconductor layer ACT may include amorphous silicon, polycrystalline silicon, an oxide semiconductor material, or an organic semiconductor material. The semiconductor layer ACT may include a channel area CN, a source area, and a drain area, the channel area CN overlapping the gate electrode GE, and the source area and the drain area being arranged on both sides of the channel area CN and including impurities. Here, the impurities may include N-type impurities or P-type impurities. Each of the source area and the drain area may be the source electrode SE and the drain electrode DE of the first thin-film transistor TFT1, respectively.

The gate electrode GE may be a single layer or a multi-layer including, for example, at least one of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in consideration of the adhesion with adjacent layers, surface flatness of stacked layers, processability, and the like. The first gate insulating layer 111 may be arranged between the semiconductor layer ACT and the gate electrode GE.

The capacitor Cst includes a lower electrode CE1 and an upper electrode CE2 overlapping each other with respect to the second gate insulating layer 112 disposed therebetween. The capacitor Cst may overlap the first thin-film transistor TFT1 in the z-direction (thickness direction). FIG. 5 illustrates that the gate electrode GE of the first thin-film transistor TFT1 is the lower electrode CE1 of the capacitor Cst. In another embodiment, the capacitor Cst may not overlap the first thin-film transistor TFT1.

Each of the first gate insulating layer 111 and the second gate insulating layer 112 may include an inorganic insulating material, such as silicon oxide, silicon nitride, silicon oxynitride, aluminum oxide, titanium oxide, tantalum oxide, or hafnium oxide. Each of the first gate insulating layer 111 and the second gate insulating layer 112 may be a single layer or a multi-layer including the above-described material.

The capacitor Cst may be covered with the interlayer insulating layer 113. The interlayer insulating layer 113 may include an inorganic insulating material, such as silicon oxide, silicon nitride, silicon oxynitride, aluminum oxide, titanium oxide, tantalum oxide, or hafnium oxide. The interlayer insulating layer 113 may be a single layer or a multi-layer including the above-described material.

The driving voltage line PL and a first connection electrode CM1 may be disposed on the interlayer insulating layer 113. Each of the driving voltage line PL and the first connection electrode CM1 may be formed as a single layer or a multi-layer including at least one of Al, Pt, Pd, Ag, Mg, Au, Ni, Nd, Ir, Cr, Li, Ca, Mo, Ti, W, and Cu. In an embodiment, each of the driving voltage line PL and the first connection electrode CM1 may be a multi-layer of Ti/Al/Ti.

The first insulating layer 115 may be disposed on the driving voltage line PL and the first connection electrode CM1. The data line DL and a second connection electrode CM2 may be disposed on the first insulating layer 115. Each of the data line DL and the second connection electrode CM2 may include the same material as that of the driving voltage line PL. For example, each of the data line DL and the second connection electrode CM2 may be a single layer or a multi-layer including at least one of Al, Pt, Pd, Ag, Mg, Au, Ni, Nd, Ir, Cr, Li, Ca, Mo, Ti, W, and Cu. In an embodiment, each of the data line DL and the second connection electrode CM2 may be a multi-layer of Ti/Al/Ti. The data line DL and the second connection electrode CM2 may be covered with the second insulating layer 118. As shown in FIG. 5, the data line DL may at least partially overlap the driving voltage line PL in the z-direction. In another embodiment, the data line DL may not overlap the driving voltage line PL.

In the embodiment of FIG. 5, the data line DL is disposed on an upper layer of the driving voltage line PL. However, in another embodiment, the data line DL may be disposed on the interlayer insulating layer 113, or the driving voltage line PL may be disposed on the first insulating layer 115, such that the data line DL and the driving voltage line PL may be arranged on the same layer. In another embodiment, the driving voltage line PL may have a double-layer structure including a lower driving voltage line and an upper driving voltage line, the lower driving voltage line being disposed on the interlayer insulating layer 113, and the upper driving voltage line being disposed on the first insulating layer 115 and electrically connected to the lower driving voltage line.

The first insulating layer 115 and the second insulating layer 118 are planarization insulating layers, and may be organic insulating layers. For example, each of the first insulating layer 115 and the second insulating layer 118 may include an organic insulating material, such as a general-purpose polymer such as polymethyl methacrylate (PMMA) or polystyrene (PS), a polymer derivative having a phenol-based group, an acryl-based polymer, an imide-based polymer, a siloxane-based polymer, an aryl ether-based polymer, an amide-based polymer, a fluorine-based polymer, a p-xylene-based polymer, a vinyl alcohol-based polymer, and a blend thereof. In an embodiment, the first insulating layer 115 and/or the second insulating layer 118 may be an organic insulating layer including PI, or may be an organic insulating layer including siloxane.

A display element, for example, first to third organic light-emitting diodes OLED1, OLED2, and OLED3 may be disposed over the second insulating layer 118 in the display area DA. In this case, the first to third organic light-emitting diodes OLED1, OLED2, and OLED3 may be spaced apart from each other, and may include the first organic light-emitting diode OLED1, the second organic light-emitting diode OLED2, and the third organic light-emitting diode OLED3 that emit light of different colors. The first organic light-emitting diode OLED1, the second organic light-emitting diode OLED2, and the third organic light-emitting diode OLED3 may emit light of different colors, or may emit light of the same color. Each of the first to third organic light-emitting diodes OLED1, OLED2, and OLED3 may include a pixel electrode 221, an intermediate layer 222, and an opposite electrode 223. Hereinafter, for convenience of description, a case where the first organic light-emitting diode OLED1, the second organic light-emitting diode OLED2, and the third organic light-emitting diode OLED3 emit light of different colors is mainly described in detail.

The pixel electrode 221 of the first to third organic light-emitting diodes OLED1, OLED2, and OLED3 may be disposed on the second insulating layer 118, and may be connected to the first thin-film transistor TFT1 through the first connection electrode CM1 disposed on the interlayer insulating layer 113 and the second connection electrode CM2 disposed on the first insulating layer 115.

The pixel electrode 221 may include a conductive oxide, such as indium tin oxide (ITO), indium zinc oxide (IZO), zinc oxide (ZnO), indium oxide ($In_2O_3$), indium gallium oxide (IGO), or aluminum zinc oxide (AZO). In another embodiment, the pixel electrode 221 may include a reflective layer including Ag, Mg, Al, Pt, Pd, Au, Ni, Nd, Ir, Cr, or a compound thereof. In another embodiment, the pixel electrode 221 may further include a layer including ITO, IZO, ZnO, or $In_2O_3$ on/under the above-described reflective layer.

The pixel-defining layer 116 may be disposed on the second insulating layer 118. The pixel-defining layer 116 may include an opening corresponding to each of pixels in the display area DA, that is, an opening OP through which a portion of the pixel electrode 221 is exposed. The opening OP of the pixel-defining layer 116 may define an emission area of a pixel. The emission area may be an area in which an emission layer is arranged and light is emitted. That is, the pixel-defining layer 116 may be arranged to correspond to the remaining area excluding the emission area, that is, a non-emission area. The size of the emission area may vary according to a color of light emitted by the pixel.

In addition, the pixel-defining layer 116 may prevent an arc or the like from occurring at an edge of the pixel electrode 221 by increasing a distance between the edge of the pixel electrode 221 and the opposite electrode 223 over the pixel electrode 221. The pixel-defining layer 116 may include, for example, an organic material such as PI or hexamethyldisiloxane (HMDSO).

The intermediate layer 222 includes an emission layer. The emission layer may include a polymer organic material or a low-molecular weight organic material that emits light of a certain color. In an embodiment, the intermediate layer 222 may include a first functional layer and/or a second functional layer, the first functional layer being disposed under the emission layer, and the second functional layer being disposed on the emission layer. The first functional layer and/or the second functional layer may include a layer that is integrally formed as a single body over a plurality of pixel electrodes 221, or may include a layer that is patterned to correspond to each of the plurality of pixel electrodes 221. In the above case, the emission layer may be arranged in each of the first organic light-emitting diode OLED1, the second organic light-emitting diode OLED2, and the third organic light-emitting diode OLED3. Here, the emission layers respectively arranged in the first organic light-emitting diode OLED1, the second organic light-emitting diode OLED2, and the third organic light-emitting diode OLED3 may include different materials. In another embodiment, a single emission layer may be arranged to cover the first organic light-emitting diode OLED1, the second organic light-emitting diode OLED2, and the third organic light-emitting diode OLED3. In this case, each of the emission layers arranged in the first organic light-emitting diode OLED1, the second organic light-emitting diode OLED2, and the third organic light-emitting diode OLED3 may include the same material, and may be arranged over the entire surface of the display area DA. Here, the emission layer may have a structure in which a plurality of different emission layers are stacked.

The first functional layer may be a single layer or a multi-layer. For example, when the first functional layer includes a polymer material, the first functional layer may be a hole transport layer (HTL) having a single-layer structure, and may include poly(3,4-ethylenedioxythiophene) (PEDOT) or polyaniline (PANI). When the first functional layer includes a low-molecular weight material, the first functional layer may include a hole injection layer (HIL) and an HTL.

The second functional layer may not always be provided. For example, when the first functional layer and the emission layer include a polymer material, the second functional layer may be formed to improve the characteristics of an organic light-emitting diode. The second functional layer may be a single layer or a multi-layer. The second functional layer may include an electron transport layer (ETL) and/or an electron injection layer (EIL).

The opposite electrode 223 is arranged to face the pixel electrode 221 with the intermediate layer 222 therebetween. The opposite electrode 223 may include a conductive material having a low work function. For example, the opposite electrode 223 may include a (semi-)transparent layer including Ag, Mg, Al, Pt, Pd, Au, Ni, Nd, Ir, Cr, Li, Ca, or an alloy thereof. Alternatively, the opposite electrode 223 may further include a layer, such as an ITO layer, an IZO layer, a ZnO layer, or an $In_2O_3$ layer on the (semi-)transparent layer including the above-described material.

The opposite electrode 223 may be integrally formed as a single body in the first to third organic light-emitting diodes OLED1, OLED2, and OLED3 in the display area DA, and may be disposed on the intermediate layer 222 and the pixel-defining layer 116 to face the plurality of pixel electrodes 221.

A plurality of spacers SPC may be further arranged in the non-emission area of the display area DA. The spacers SPC may be arranged around the pixel electrodes 221, that is, between the pixel electrodes 221. The spacer SPC may be disposed on the pixel-defining layer 116. The spacer SPC may be an insulating pattern having an island shape. The spacer SPC may have a polygonal shape, such as a square, a circle, a triangle, or an oval. The spacer SPC may include an organic insulating material, such as PI. Alternatively, the spacer SPC may include an inorganic insulating material, such as silicon nitride or silicon oxide, or may include an organic insulating material and an inorganic insulating material. The spacer SPC may include a material different from that of the pixel-defining layer 116. Alternatively, the spacer SPC may include the same material as one of the first insulating layer 115, the second insulating layer 118, and the pixel-defining layer 116. The opposite electrode 223 may be disposed on the spacer SPC.

A thin-film encapsulation layer 300 may shield the display portion DS. The thin-film encapsulation layer 300 may be disposed on the opposite electrode 223 to protect the display panel 10 from external foreign substances or moisture. The thin-film encapsulation layer 300 may include at least one organic encapsulation layer and at least one inorganic encapsulation layer. FIG. 5 illustrates that the thin-film encapsulation layer 300 includes first and second inorganic encapsulation layers 310 and 330 and an organic encapsulation layer 320 disposed therebetween. In another embodiment, the number of organic encapsulation layers, the number of inorganic encapsulation layers, and the stacking order may be changed.

In another case, a plurality of layers including the capping layer 230 may be arranged between the first inorganic encapsulation layer 310 and the opposite electrode 223. Although FIG. 5 illustrates a case where the capping layer 230 is provided, in another embodiment, the capping layer 230 may be omitted.

Each of the first and second inorganic encapsulation layers 310 and 330 may include at least one inorganic insulating material, such as aluminum oxide, titanium oxide, tantalum oxide, hafnium oxide, zinc oxide, silicon oxide, silicon nitride, or silicon oxynitride. The organic encapsulation layer 320 may include PET, PEN, polycarbonate, PI, polyethylene sulfonate, polyoxymethylene, PAR, HMDSO, an acryl-based resin (e.g., PMMA, polyacrylic acid, etc.), or any combination thereof. Because the first inorganic encapsulation layer 310 is formed along a structure thereunder, an upper surface of the first inorganic encapsulation layer 310 may not be flat. The organic encapsulation layer 320 may cover the first inorganic encapsulation layer 310 and have a sufficient thickness. An upper surface of the organic encapsulation layer 320 may be substantially flat. The second inorganic encapsulation layer 330 may extend outside the organic encapsulation layer 320 to be in contact with the first inorganic encapsulation layer 310, thereby preventing the organic encapsulation layer 320 from being exposed to the outside.

Next, the peripheral area PA is described. The peripheral area PA of FIG. 5 may correspond to a portion of the lower side of the display area DA shown in FIG. 3. The peripheral area PA may include a first sub-peripheral area SPA1 and a second sub-peripheral area SPA2, the first sub-peripheral area SPA1 being relatively adjacent to the display area DA, and the second sub-peripheral area SPA2 being relatively adjacent to an edge of the substrate 100 outside the first sub-peripheral area SPA1. The first insulating layer 115, the second insulating layer 118, and the pixel-defining layer 116 may extend from the display area DA and be arranged in the first sub-peripheral area SPA1. A valley portion V may be arranged in the second sub-peripheral area SPA2. In this case, the valley portion V may be disposed over an inorganic layer. For example, the valley portion V may be disposed over an inorganic insulating layer including at least one of the buffer layer 110, the first gate insulating layer 111, the second gate insulating layer 112, and the interlayer insulating layer 113.

As shown in FIG. 3, the driving voltage supply line 11 may be arranged in the peripheral area PA on the lower side of the display area DA. The driving voltage supply line 11 may be arranged in the first sub-peripheral area SPA1 and the second sub-peripheral area SPA2. The driving voltage supply line 11 may be arranged between the first insulating layer 115 and the second insulating layer 118 in the first sub-peripheral area SPA1, and may be disposed over the interlayer insulating layer 113 in the second sub-peripheral area SPA2.

A plurality of holes 11H may be defined in the driving voltage supply line 11 arranged in the first sub-peripheral area SPA1. The holes 11H may function as outgassing passages for discharging gas generated from the first insulating layer 115 to the outside, and thus, it is possible to prevent or reduce deterioration of the quality of an image implemented in the display device due to penetration of the gas generated in the first insulating layer 115 or moisture into the display area DA. The driving voltage supply line 11 may include the same material as one of wirings arranged between the first insulating layer 115 and the second insulating layer 118 in the display area DA. For example, the driving voltage supply line 11 may include the same material as that of the data line DL disposed on the first insulating layer 115 of the display area DA.

At least one wiring may be further provided in the first sub-peripheral area SPA1, the at least one wiring being arranged between the interlayer insulating layer 113 and the first insulating layer 115 and overlapping the driving voltage supply line 11. The at least one wiring may include the same material as one of wirings arranged between the interlayer insulating layer 113 and the first insulating layer 115 in the display area DA. For example, the at least one wiring may include the same material as that of the driving voltage line PL disposed on the interlayer insulating layer 113 of the display area DA.

A plurality of fan-out lines FW may be arranged in the peripheral area PA on the lower side of the display area DA. In an embodiment, as shown in FIG. 5, the fan-out lines FW may be arranged on different layers with at least one insulating layer therebetween. For example, first fan-out lines FW1 on the first gate insulating layer 111 and second fan-out lines FW2 on the second gate insulating layer 112 may be alternately arranged. Accordingly, an interval between an adjacent pair of the fan-out lines FW may be reduced. In another embodiment, the fan-out lines FW may be arranged on the same layer. For example, the fan-out lines FW may be disposed on the first gate insulating layer 111, or may be disposed on the second gate insulating layer 112. The fan-out lines FW may be arranged in the first sub-peripheral area SPA1 and the second sub-peripheral area SPA2.

The first scan driving circuit SDRV1 and the second scan driving circuit SDRV2 may be arranged in the first sub-peripheral area SPA1.

The first inorganic encapsulation layer 310 and the second inorganic encapsulation layer 330 may be arranged to cover the valley portion V. The position of the organic encapsulation layer 320 is limited by the valley portion V, and thus, a material for forming the organic encapsulation layer 320 may be prevented from overflowing to the outside of the valley portion V. An input sensing layer (not shown) may be disposed on the thin-film encapsulation layer 300. The input sensing layer may include a touch sensing layer TSL. In this case, the touch sensing layer TSL may have a structure in which a first touch conductive layer TCL1, a first touch insulating layer TNS1, a second touch conductive layer TCL2, and a second touch insulating layer TNS2 are sequentially stacked in the z-direction. The touch sensing layer TSL may further include a touch buffer layer TBF disposed on the thin-film encapsulation layer 300.

In some embodiments, the second touch conductive layer TCL2 may serve as a touch electrode for sensing contact or non-contact, and the first touch conductive layer TCL1 may serve as a connector for connecting, in one direction, the second touch conductive layers TCL2 that are patterned.

In some embodiments, both the first touch conductive layer TCL1 and the second touch conductive layer TCL2 may serve as touch electrodes. For example, the first touch insulating layer TNS1 may include a via hole exposing an upper surface of the first touch conductive layer TCL1, and the first touch conductive layer TCL1 may be connected to the second touch conductive layer TCL2 through the via hole. As such, due to the use of the first touch conductive layer TCL1 and the second touch conductive layer TCL2, the resistance of a touch electrode may decrease, and thus, the response speed of the touch sensing layer TSL may be improved.

In some embodiments, a touch electrode may have a mesh structure through which light emitted from the first to third organic light-emitting diodes OLED1, OLED2, and OLED3 may pass. Accordingly, the first touch conductive layer TCL1 and the second touch conductive layer TCL2 may be arranged not to overlap emission areas of the first to third organic light-emitting diodes OLED1, OLED2, and OLED3.

Each of the first touch conductive layer TCL1 and the second touch conductive layer TCL2 may be a single layer or a multi-layer including a conductive material having high conductivity. For example, each of the first touch conductive layer TCL1 and the second touch conductive layer TCL2 may be a single layer or a multi-layer including a transparent conductive layer and a conductive material including Al, Cu, Mo, and/or Ti. The transparent conductive layer may include a transparent conductive oxide, such as ITO, IZO, ZnO, or indium tin zinc oxide (ITZO). In addition, the transparent conductive layer may include a conductive polymer, such as PEDOT, metal nanowires, or graphene. In some embodiments, the first touch conductive layer TCL1 may include Mo, and the second touch conductive layer TCL2 may have a stacked structure of Ti/Al/Ti.

The first touch conductive layer TCL1 or the second touch conductive layer TCL2 may be connected to a touch wiring CNM passing through the peripheral area PA. In this case, the touch wiring CNM may be connected to the terminal portion PAD shown in FIG. 3.

Each of the first touch insulating layer TNS1 and the second touch insulating layer TNS2 may include an inorganic material or an organic material. The inorganic material may include at least one of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride. The organic material may include at least one of an acryl-based resin, a methacryl-based resin, polyisoprene, a vinyl-based resin, an epoxy-based resin, a urethane-based resin, a cellulose-based resin, and a perylene-based resin.

In an embodiment, the second touch insulating layer TNS2 may be arranged over the entire display area DA. In this case, an optical functional film, such as a color filter or a polarizing film, may be disposed on the second touch insulating layer TNS2.

In another embodiment, a color filter may be disposed on the second touch insulating layer TNS2, or a quantum dot layer, a light-transmitting layer, and a color filter may be disposed on the second touch insulating layer TNS2. Hereinafter, for convenience of description, a case where a quantum dot layer, a light-transmitting layer, and a color filter are disposed on the second touch insulating layer TNS2 is mainly described in detail.

The second touch insulating layer TNS2 may have a pattern shape. For example, the second touch insulating layer TNS2 may completely shield the second touch conductive layer TCL2. A high-refractive index layer 700 may be disposed on the second touch insulating layer TNS2. The high-refractive index layer 700 may cover the entire surface of the display area DA.

The second touch insulating layer TNS2 and the high-refractive index layer 700 may have different refractive indices. For example, the refractive index of the second touch insulating layer TNS2 may be less than that of the high-refractive index layer 700. In detail, the refractive index of the second touch insulating layer TNS2 may be from about 1.3 to about 1.6, and the refractive index of the high-refractive index layer 700 may be from about 1.7 to about 1.9.

The high-refractive index layer 700 may include an acryl-based or siloxane-based organic material. In some embodiments, the high-refractive index layer 700 may include polydiarylsiloxane, methyltrimethoxysilane, or tetramethoxysilane. In an embodiment, the high-refractive index layer 700 may be formed by applying the above-described material through an inkjet printing process and then hardening the material. In another embodiment, the high-refractive index layer 700 may be formed through an evaporation process.

In an embodiment, metal oxide particles, such as zinc oxide (ZnO) particles, titanium oxide ($TiO_2$) particles, zirconium oxide ($ZrO_2$) particles, or barium titanate ($BaTiO_3$) particles, may be dispersed in the high-refractive index layer 700. In an embodiment, the high-refractive index layer 700 may be formed by applying an organic material including metal oxide particles by inkjet printing. The touch buffer layer TBF may be further arranged between the thin-film encapsulation layer 300 and the touch sensing layer TSL. The touch buffer layer TBF may be formed directly on the thin-film encapsulation layer 300. The touch buffer layer TBF may prevent damage to the thin-film encapsulation layer 300, and may block an interference signal that may be generated when the touch sensing layer TSL is driven. The touch buffer layer TBF may include an inorganic insulating material, such as silicon oxide ($SiO_2$), silicon nitride ($SiN_x$), or silicon oxynitride (SiON), and may be a single layer or a multi-layer.

Although not shown in the drawings, a quantum dot layer and a light-transmitting layer may be disposed on the touch sensing layer TSL at positions corresponding to each pixel.

A first-color filter layer may be arranged to correspond to the first organic light-emitting diode OLED1, a second-color filter layer may be arranged to correspond to the second organic light-emitting diode OLED2, and a third-color filter layer may be arranged to correspond to the third organic light-emitting diode OLED3.

The first-color filter layer may transmit only light of a wavelength ranging from about 450 nm to about 495 nm, the second-color filter layer may transmit only light of a wavelength ranging from about 495 nm to about 570 nm, and the third-color filter layer may transmit only light of a wavelength ranging from about 630 nm to about 780 nm. The first-color filter layer to the third-color filter layer may reduce external light reflection in the display device.

For example, when external light reaches the first-color filter layer, only light of the preset wavelength described above passes through the first-color filter layer, and light of other wavelengths is absorbed by the first-color filter layer. Accordingly, among external light incident on the display device, only the light of the preset wavelength described above passes through the first-color filter layer, and a portion of the light is reflected by the opposite electrode 223 or by the first pixel electrode thereunder and emitted to the outside. The above description may apply to the second-color filter layer and the third-color filter layer.

Although FIG. 5 illustrates a case where transistors of the pixel circuit PC are P-type transistors, an embodiment of the disclosure is not limited thereto. For example, the transistors of the pixel circuit PC may be N-type transistors, or some of the transistors may be P-type transistors and the remaining transistors may be N-type transistors, and other various embodiments are possible.

Figure 6:
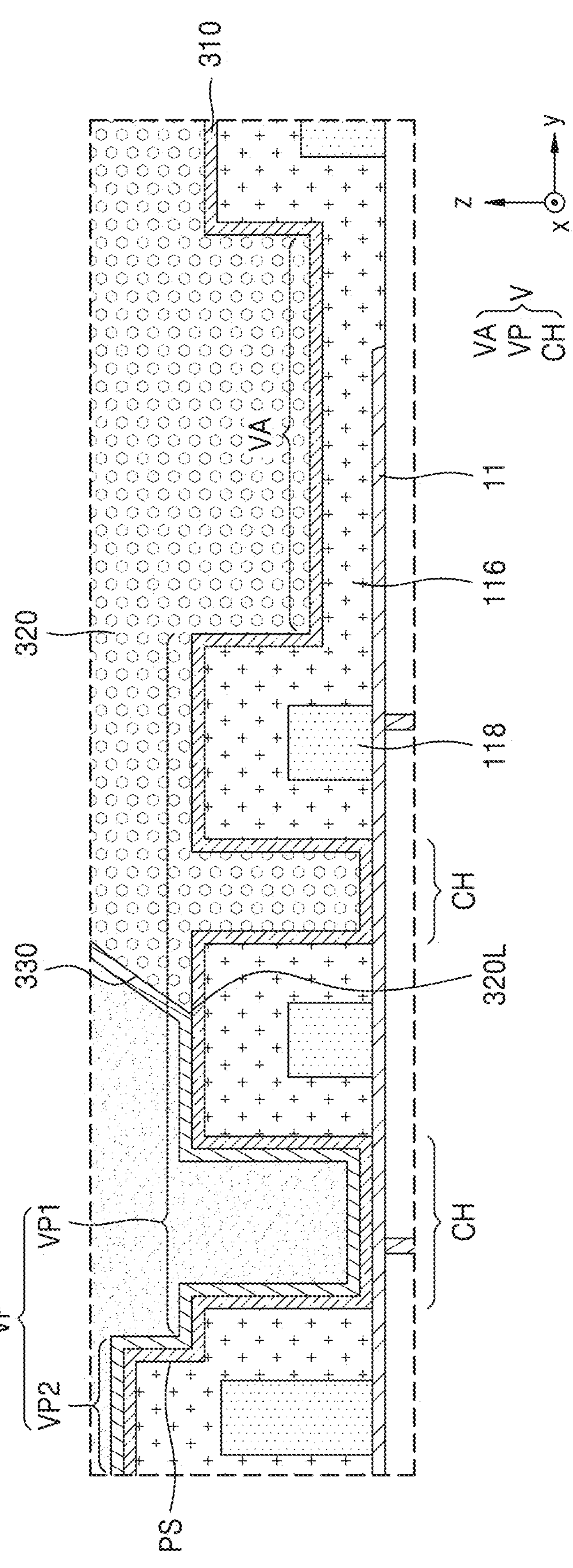
FIG. 6 is an enlarged cross-sectional view illustrating a region B of FIG. 5.
Figure 7A:
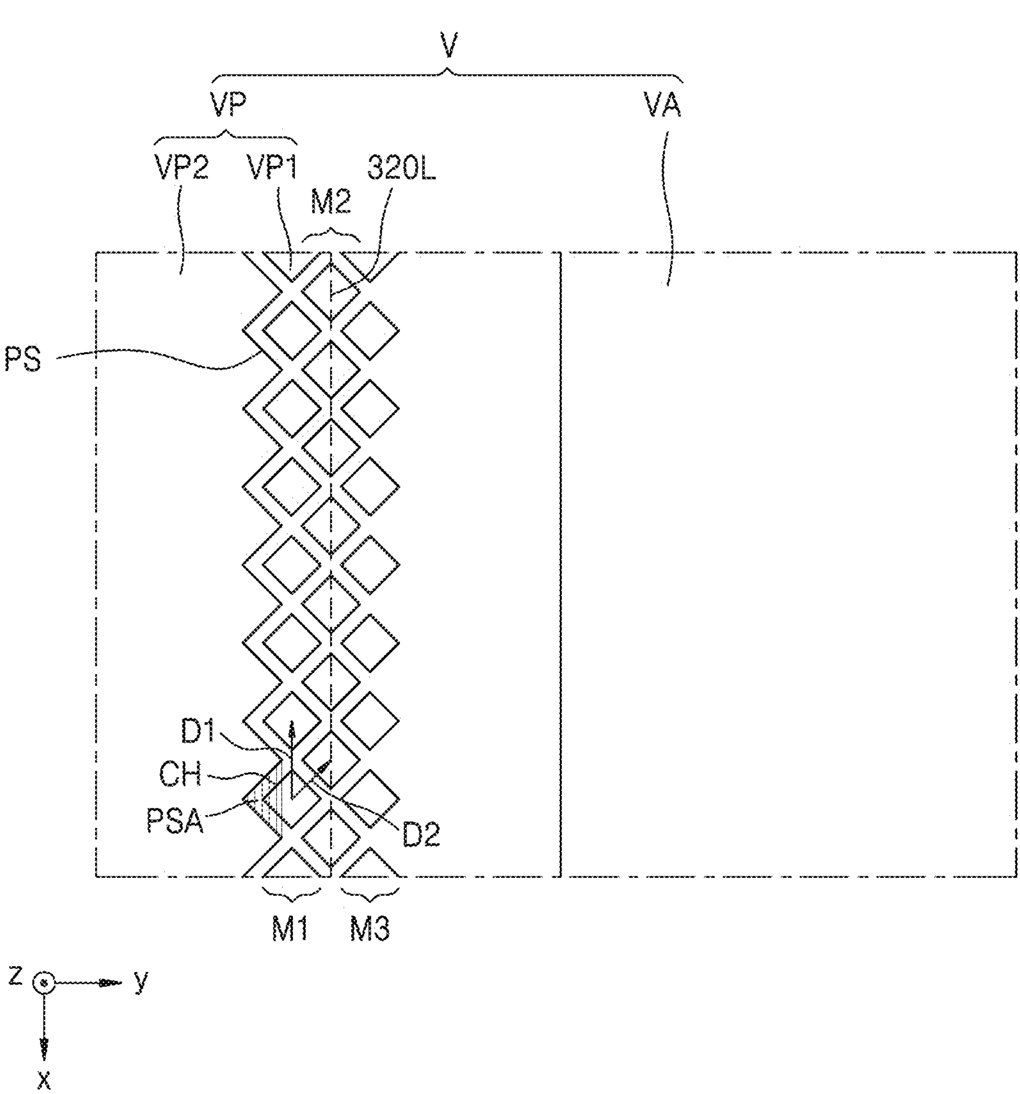
FIGS. 7A and 7B are plan views schematically illustrating a valley portion shown in FIG. 6.
Figure 7B:
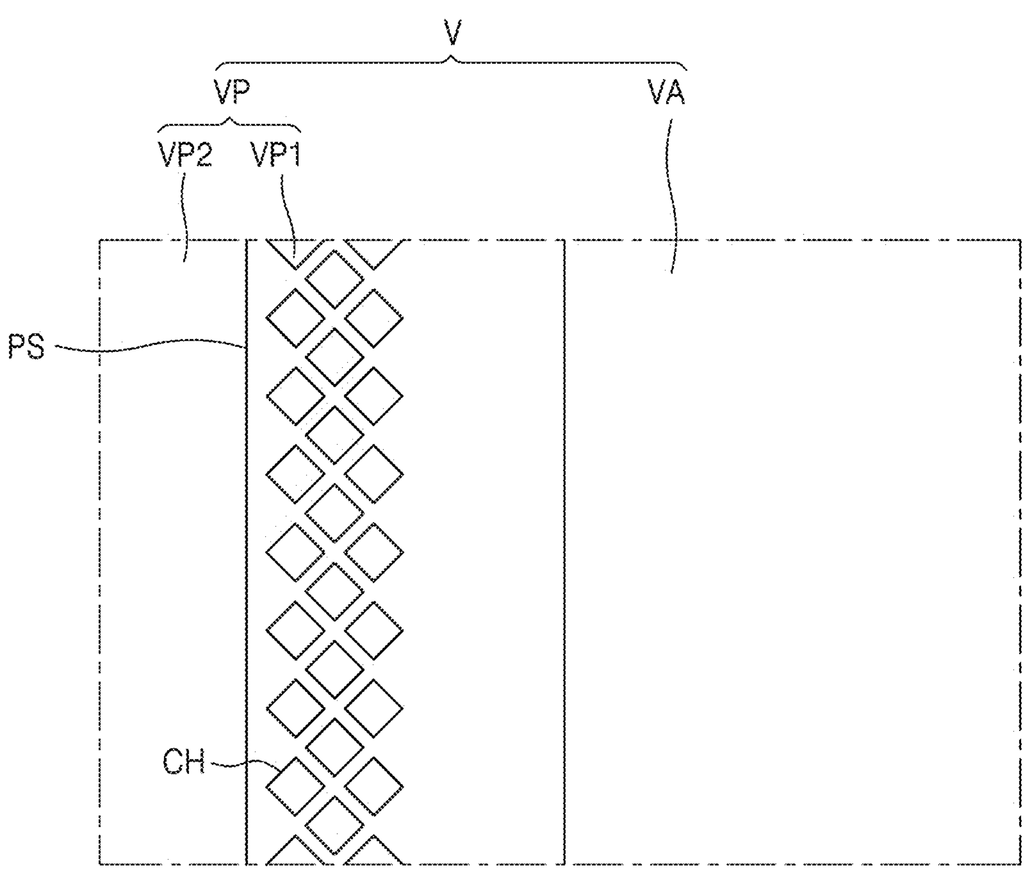
Figure 7B:
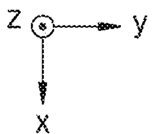

FIG. 6 is an enlarged cross-sectional view illustrating a region B of FIG. 5, and FIGS. 7A and 7B are plan views schematically illustrating the valley portion V shown in FIG. 6.

Referring to FIGS. 6, 7A, and 7B, the valley portion V may include a valley VA, a valley peak VP, and a control hole CH.

The valley VA may accommodate the organic encapsulation layer 320. The valley peak VP may be arranged outside the valley VA, and at least a portion of the valley peak VP may be higher than a lower surface of the valley VA. The valley peak VP may include a first valley peak VP1 and a second valley peak VP2. The second valley peak VP2 may be arranged outside the first valley peak VP1, and at least a portion of the second valley peak VP2 may be formed to be higher than the first valley peak VP1. In this structure, the valley VA, the first valley peak VP1, and the second valley peak VP2 may be sequentially arranged in the y-direction in FIG. 6, and the height of an upper surface of the valley portion V may increase. The control hole CH may be arranged in the valley peak VP. The control hole CH may be depressed in a downward direction from an upper surface of the first valley peak VP1.

The control hole CH arranged at the valley peak VP may restrict the flow of the organic encapsulation layer 320. The control hole CH may control the position of an end 320L of the organic encapsulation layer 320. For example, the control hole CH may be arranged in the first valley peak VP1. Accordingly, in a state in which the valley VA overlaps the organic encapsulation layer 320, the end 320L of the organic encapsulation layer 320 may be disposed on the first valley peak VP1. In this case, the second valley peak VP2 may prevent the organic encapsulation layer 320 from overflowing to the outside of the second valley peak VP2.

The second valley peak VP2 may include a peak surface PS formed along a boundary with the first valley peak VP1. For example, the peak surface PS may include an uneven shape. Because the peak surface PS includes an uneven shape, the area of the peak surface PS may increase when viewed from above as shown in FIG. 7A. Accordingly, the organic encapsulation layer 320 may be effectively prevented from overflowing to the outside of the second valley peak VP2. When viewed from above as shown in FIG. 7A, the peak surface PS may include at least one sawtooth (zig-zag) shape. The at least one sawtooth shape may be arranged to protrude in the y-axis direction. However, the embodiment shown in FIG. 7A is merely an example, and the shape of the peak surface PS is not limited thereto. For example, as shown in FIG. 7B, the peak surface PS may have a linear shape.

The organic encapsulation layer 320 may be formed by supplying an organic material onto the first inorganic encapsulation layer 310 by an inkjet method. Here, the organic encapsulation layer 320 may flow on one surface of the first inorganic encapsulation layer 310. Here, a plurality of control holes CH as described above may hinder the flow of the organic encapsulation layer 320. In this case, as shown in FIG. 5, a highest point 320-2 and a lowest point 320-1 of the organic encapsulation layer 320 may occur, wherein a height measured from a lower surface of the substrate 100 to the upper surface of the organic encapsulation layer 320 near the end 320L of the organic encapsulation layer 320 is greatest at the highest point 320-2 and is smallest at the lowest point 320-1. A flat surface may be provided along y-direction with respect to the lowest point 320-1 of the organic encapsulation layer 320. In this structure, a ratio of the area of the flat surface of the organic encapsulation layer 320 to the total area of the organic encapsulation layer 320 may increase. Accordingly, the area of the peripheral area PA may be reduced. In addition, the lowest point 320-1 of the organic encapsulation layer 320 may be prevented from being visible due to a difference between the height of the lowest point 320-1 of the organic encapsulation layer 320 and the height of the flat surface of the organic encapsulation layer 320.

In detail, when the organic encapsulation layer 320, in which the plurality of control holes CH are arranged, flows and meets edges of the plurality of control holes CH, the movement of the organic encapsulation layer 320 may be hindered. That is, each control hole CH may hinder the movement of the organic encapsulation layer 320 by making a surface contact angle of the organic encapsulation layer 320 greater than that in a case where the control hole CH is not provided. In this case, the height of the highest point 320-2 of the organic encapsulation layer 320 (which is measured from the lower surface of the substrate 100 to the upper surface of the organic encapsulation layer 320) may be formed to be greater than that in the case where the control hole CH is not provided, and thus, the height of the lowest point 320-1 of the organic encapsulation layer 320 may be maintained to be greater than before the control hole CH is provided. As a result, the height of the lowest point 320-1 of the organic encapsulation layer 320 and the height of the flat portion of the organic encapsulation layer 320 may be maintained to be substantially the same as each other.

In the above case, when the control hole CH is provided, a distance from a certain reference point to the end 320L of the organic encapsulation layer 320 may be reduced by about 10%, as compared with the case where the control hole CH is not provided.

One portion of the pixel-defining layer 116 may be arranged in the valley VA, and the other portion of the pixel-defining layer 116 covering the second insulating layer 118 may be arranged in the valley peak VP. The second insulating layer 118 is additionally arranged in the valley peak VP, unlike in the valley VA, and thus, at least a portion of the valley peak VP may be higher than the lower surface of the valley VA. That is, a portion of the pixel-defining layer 116 may be recessed to accommodate the organic encapsulation layer 320. A height difference between the valley VA and the valley peak VP may be determined by adjusting the height of the second insulating layer 118.

The height of the second insulating layer 118 arranged in the second valley peak VP2 may be greater than the height of the second insulating layer 118 arranged in the first valley peak VP1. In this structure, the height of the second valley peak VP2 may be greater than the height of the first valley peak VP1. A height difference between the first valley peak VP1 and the second valley peak VP2 may be determined by adjusting the height of the second insulating layer 118.

The control hole CH may be arranged in another portion of the pixel-defining layer 116 that is higher than the recessed portion of the pixel-defining layer 116. The control hole CH may be depressed in the downward direction from the upper surface of the first valley peak VP1. The control hole CH may pass through the pixel-defining layer 116.

The thin-film encapsulation layer 300 may shield the valley portion V. That is, the first inorganic encapsulation layer 310 may cover the valley portion V, and the organic encapsulation layer 320 may be disposed on the first inorganic encapsulation layer 310 such that the end 320L is disposed on the first valley peak VP1. In addition, the second inorganic encapsulation layer 330 may cover the first inorganic encapsulation layer 310 and the organic encapsulation layer 320.

In the plan view as shown in FIG. 7A, at least a portion of the control hole CH may be arranged in an area PSA between edges of two adjacent sawtooth shapes. Because a portion of the control hole CH is arranged in the area PSA between two adjacent sawtooth shapes, the number of control holes CH with respect to space may increase.

A plurality of control holes CH may be provided, and the plurality of control holes CH may be spaced apart from each other in at least one of a first direction D1 and a second direction D2 in a plan view as shown in FIG. 7A. In the plan view as shown in FIG. 7A, the first direction D1 may be an x-axis direction, and the second direction D2 may be a direction that is not perpendicular to the first direction D1. The plurality of control holes CH may be arranged to form a row in the x-axis direction. For example, the plurality of control holes CH may be arranged to form a first row M1, a second row M2, and a third row M3 in the x-axis direction, the first row M1 being adjacent to the peak surface PS, the second row M2 being arranged inward and adjacent to the first row M1, and the third row M3 being arranged inward and adjacent to the second row M2. Because the plurality of control holes CH are arranged such that the first direction D1 and the second direction D2 are not perpendicular to each other, the control holes CH constituting the first row M1 and the control holes CH constituting the second row M2 may be arranged to be shifted from each other. In this structure, the plurality of control holes CH may be arranged more densely in the first valley peak VP1.

In the plan view as shown in FIG. 7A, the planar shape of the control hole CH may be a polygon. For example, the planar shape of the control hole CH may be a rhombus. In this shape, one of vertices of the rhombus may be arranged in the area PSA between edges of two adjacent sawtooth shapes.

FIGS. 8A, 8B, 8C, 8D, and 8E are enlarged cross-sectional views illustrating the region B of FIG. 5 according to another embodiment.

Referring to FIGS. 6 and 8A, 8B, 8C, 8D, and 8E, at least one of the second insulating layer 118, the pixel-defining layer 116, and the spacer SPC may be arranged in the valley portion V. The control hole CH may be formed in different layers in a depth direction. The control hole CH may penetrate at least a portion of at least one of the second insulating layer 118 and the pixel-defining layer 116.

Figure 8A:
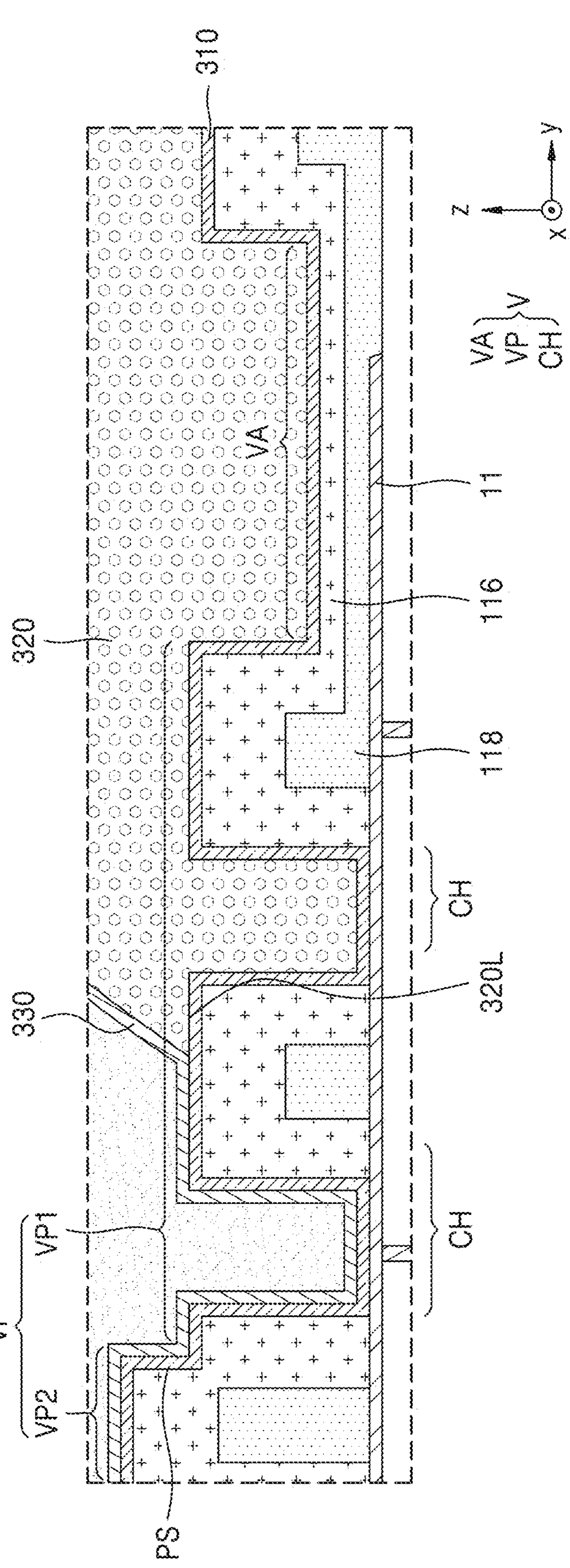
FIGS. 8A, 8B, 8C, 8D, and 8E are enlarged cross-sectional views illustrating the region B of FIG. 5 according to another embodiment.

In the valley portion V according to the embodiment of FIG. 8A, the second insulating layer 118 may be additionally arranged in the valley VA, unlike in the valley VA described with reference to FIG. 6. That is, the second insulating layer 118 and the pixel-defining layer 116 covering the second insulating layer 118 may be arranged in the valley VA. In this structure, the second insulating layer 118 arranged in the valley VA and the second insulating layer 118 arranged in the valley peak VP may be integrally formed as a single body. The height difference between the valley VA and the valley peak VP may be determined by adjusting the height of the second insulating layer 118.

Figure 8B:
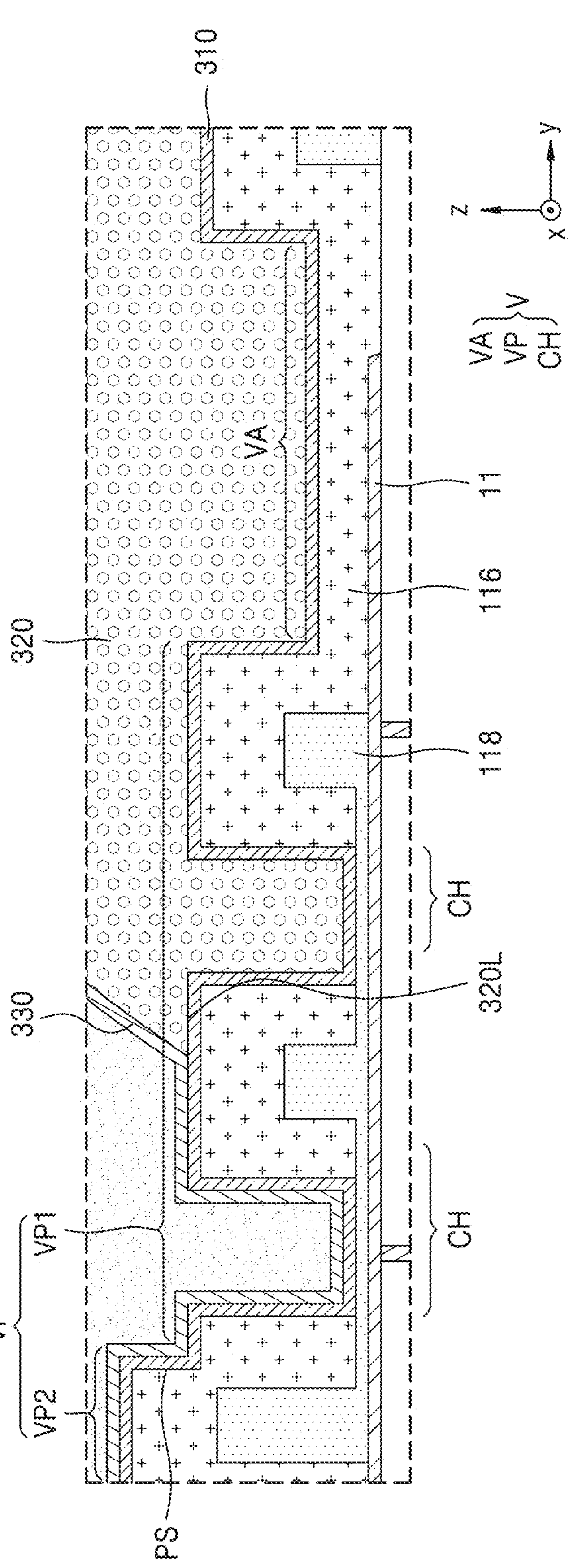

In the valley portion V according to the embodiment of FIG. 8B, the second insulating layer 118 arranged in the valley VA may be integrally formed as a single body, unlike in the valley VA described with reference to FIG. 6. In this case, the control hole CH may be depressed from an upper surface of the pixel-defining layer 116 to an upper surface of the second insulating layer 118 through the pixel-defining layer 116. In this structure, the depth of the control hole CH may be determined by adjusting the height of the second insulating layer 118 connecting the first valley peak VP1 to the second valley peak VP2.

Figure 8C:
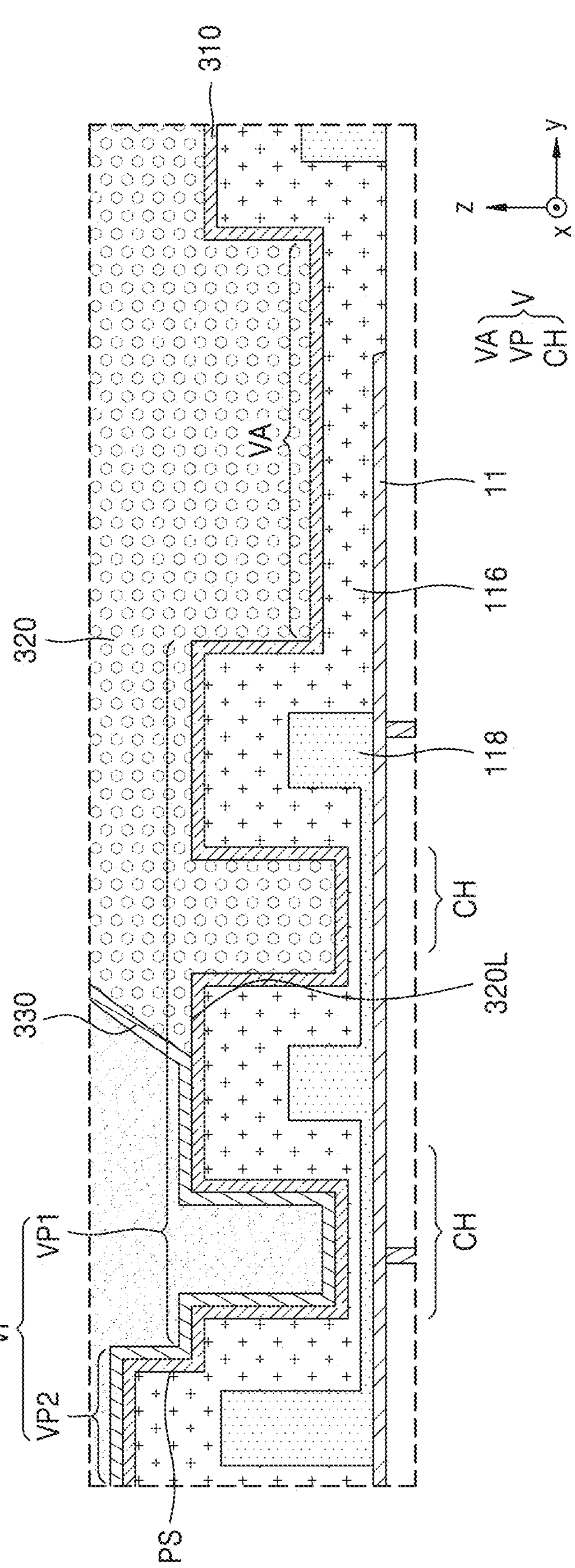

In the valley portion V according to the embodiment of FIG. 8C, the control hole CH may be formed so as not to entirely penetrate the pixel-defining layer 116, unlike the control hole CH described with reference to FIG. 6. That is, the pixel-defining layer 116 may be disposed on the second insulating layer 118, and the control hole CH may be disposed on the pixel-defining layer 116. In this structure, the pixel-defining layer 116 may be integrally formed as a single body throughout the valley portion V.

Figure 8D:
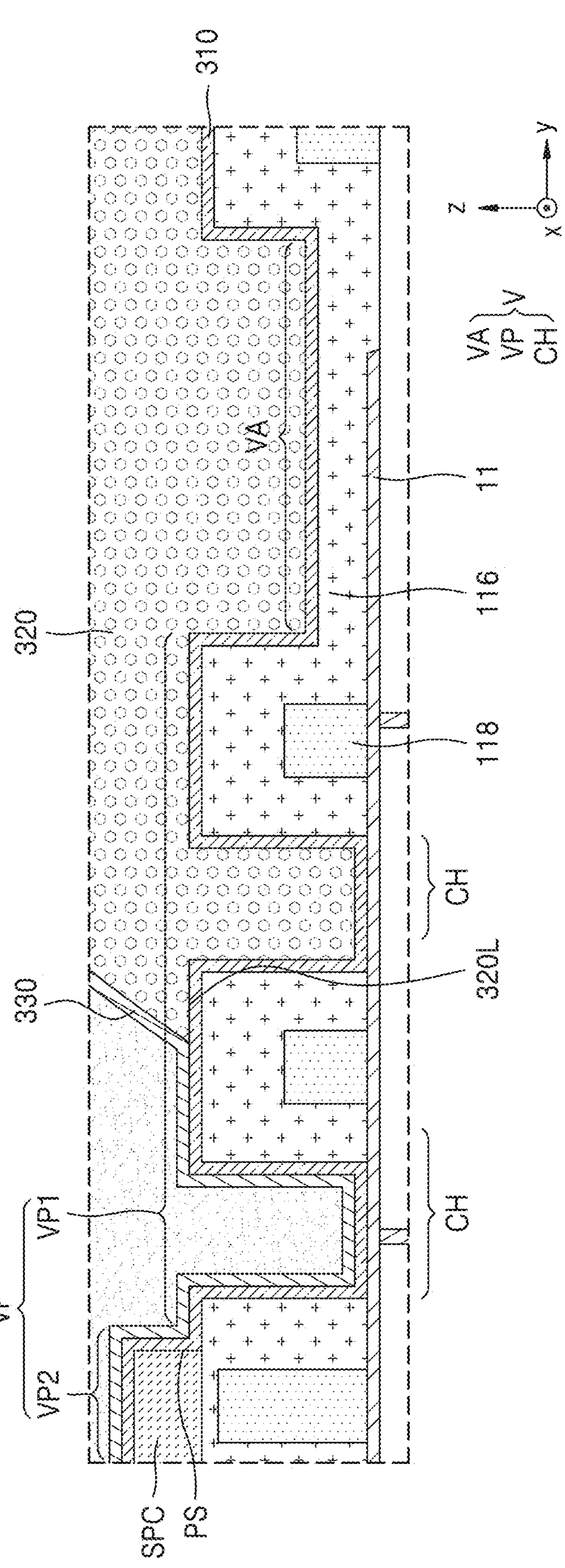

In the valley portion V according to the embodiment of FIG. 8D, unlike the control hole CH described with reference to FIG. 6, the spacer SPC may be arranged in the second valley peak VP2. The second insulating layer 118, the pixel-defining layer 116, and the spacer SPC may be arranged in the second valley peak VP2, the pixel-defining layer 116 being disposed on the second insulating layer 118, and the spacer SPC being disposed on the pixel-defining layer 116. In this structure, the height difference between the first valley peak VP1 and the second valley peak VP2 may be determined by adjusting the height of the spacer SPC.

Figure 8E:
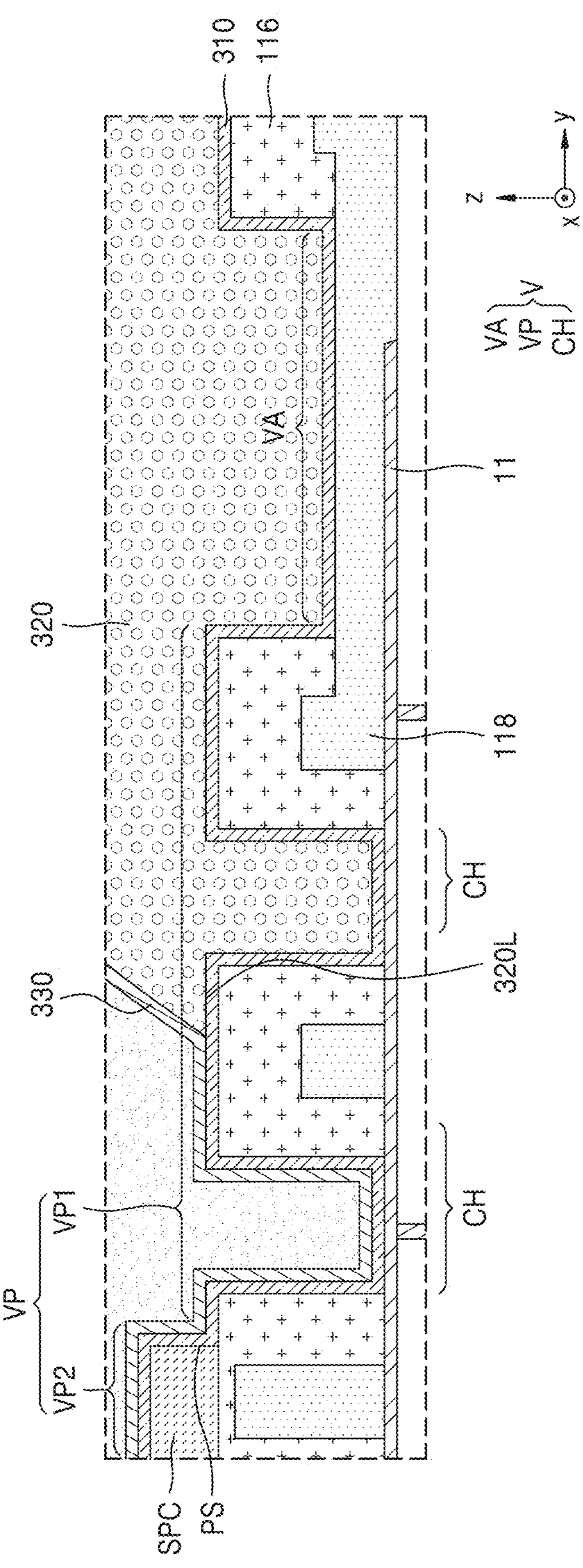

In the valley portion V according to the embodiment of FIG. 8E, the second insulating layer 118 may be arranged in the valley VA and the pixel-defining layer 116 may not be arranged in the valley VA, unlike in the valley VA described with reference to FIG. 6. That is, the second insulating layer 118 may be arranged in the valley portion V, and the second insulating layer 118 and the pixel-defining layer 116 covering the second insulating layer 118 may be arranged in the valley peak VP. In this structure, the second insulating layer 118 arranged in the valley VA and the second insulating layer 118 arranged in the valley peak VP may be integrally formed as a single body. The height difference between the valley VA and the valley peak VP may be determined by adjusting the height of the second insulating layer 118.

Figure 9A:
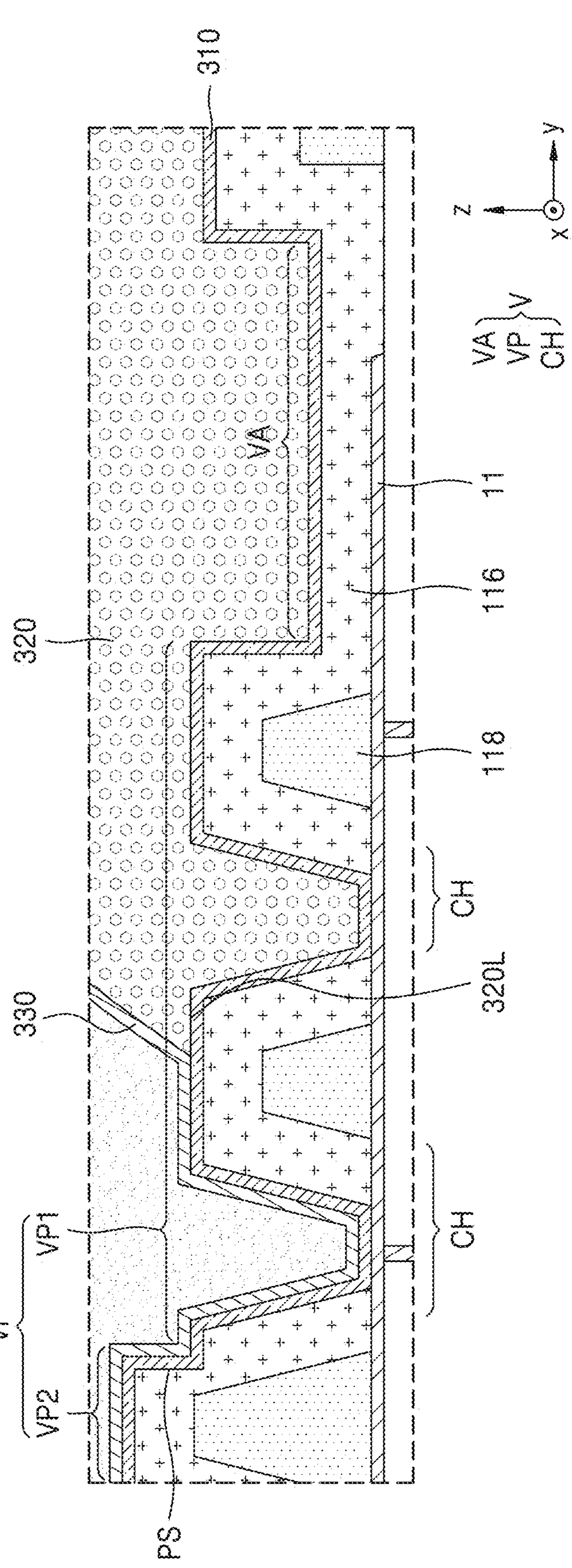
FIGS. 9A and 9B are enlarged cross-sectional views illustrating the region B of FIG. 5 according to another embodiment.
Figure 9B:
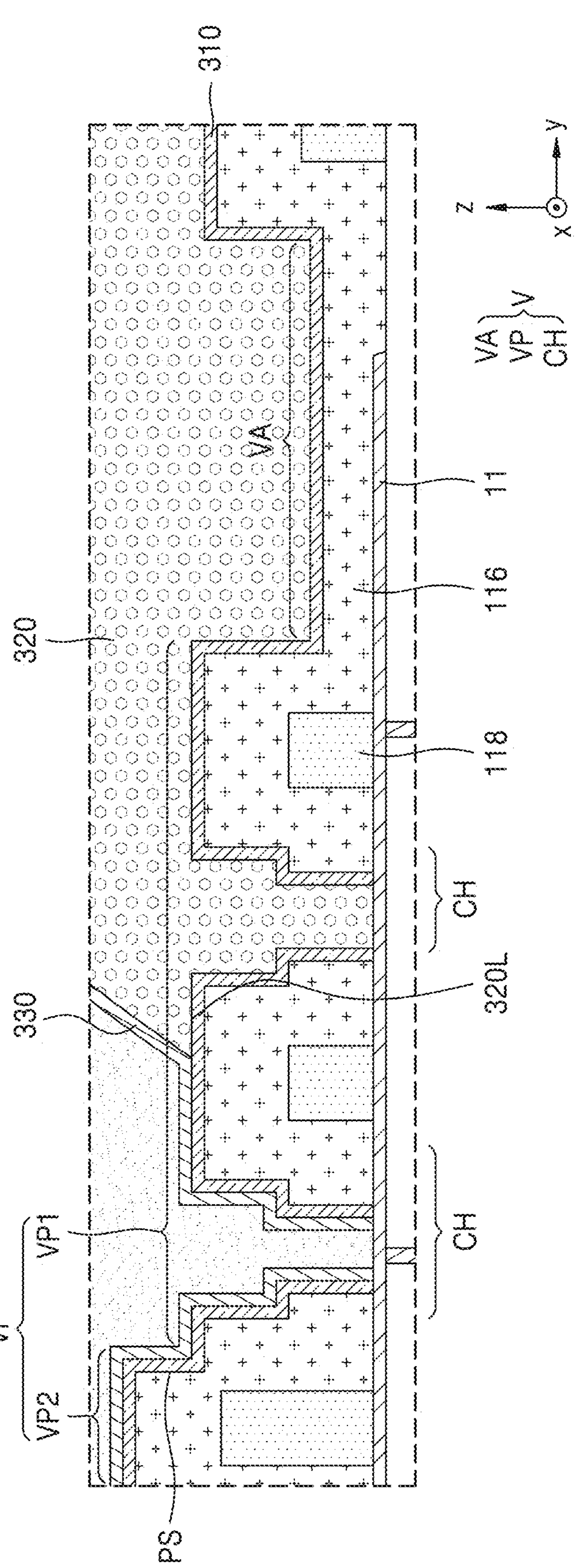

FIGS. 9A and 9B are enlarged cross-sectional views illustrating the region B of FIG. 5 according to another embodiment.

Referring to FIGS. 6, 9A, and 9B, a cross-section of the control hole CH may have various shapes.

For example, as shown in FIG. 6, the cross-section of the control hole CH may have a rectangular shape. In this case, a surface of the control hole CH formed in the y-axis direction may be perpendicular to a surface of the control hole CH formed in the z-axis direction.

In another embodiment, the cross-sectional shape of the control hole CH may be a trapezoid as shown in FIG. 9A. In this case, a side surface of the cross-sectional shape of the control hole CH may be inclined. That is, the surface of the control hole CH formed in the y-direction may not be perpendicular to the surface of the control hole CH formed in the z-direction.

In another embodiment, the cross-sectional shape of the control hole CH may be stepped as shown in FIG. 9B. In this case, among side surfaces of the control hole CH, the surface formed in the y-direction may be flat, and the surface formed in the z-axis direction may be inclined or straight. In addition, a portion of the side surface of the control hole CH, to which the surface formed in the y-direction is connected, may be sharp or rounded.

In the above case, when the side surface of the control hole CH is stepped, the planar shape of the control hole CH may have a smaller size while retaining the same shape. For example, when the planar shape of the control hole CH is circular, a first circle having the largest diameter may become the planar shape of an uppermost surface of the control hole CH, and a second circle disposed under the first circle in a depth direction (e.g., the z-direction) on an upper surface of the control hole CH may have a smaller diameter than the first circle. This relationship may continue in the depth direction of the control hole CH, and thus, the side surface of the control hole CH may be stepped. In another embodiment, the planar shape of the upper surface of the control hole CH may be different from the planar shape of a flat surface arranged in the depth direction of the control hole CH. In detail, the planar shape of the upper surface of the control hole CH may be a circle, and the planar shape of the flat surface that is arranged under the upper surface of the control hole CH in the depth direction of the control hole CH may be a polygon, an oval, or an irregular shape.

The cross-sectional shape of the control hole CH is not limited to the above-described embodiments. For example, the cross-sectional shape of one of the plurality of control holes CH and the cross-sectional shape of another one of the plurality of control hole CH may be different from each other.

In addition, a cross section of the peak surface PS may have various shapes. For example, as shown in FIGS. 6, 9A, and 9B, the peak surface PS may have a longitudinal direction that is perpendicular to the first valley peak VP1. In another embodiment, the cross-sectional shape of the peak surface PS may be inclined. In another embodiment, the cross-sectional shape of the peak surface PS may be stepped. However, this is merely an example, and the cross-sectional shape of the peak surface PS is not limited thereto.

Figure 10A:
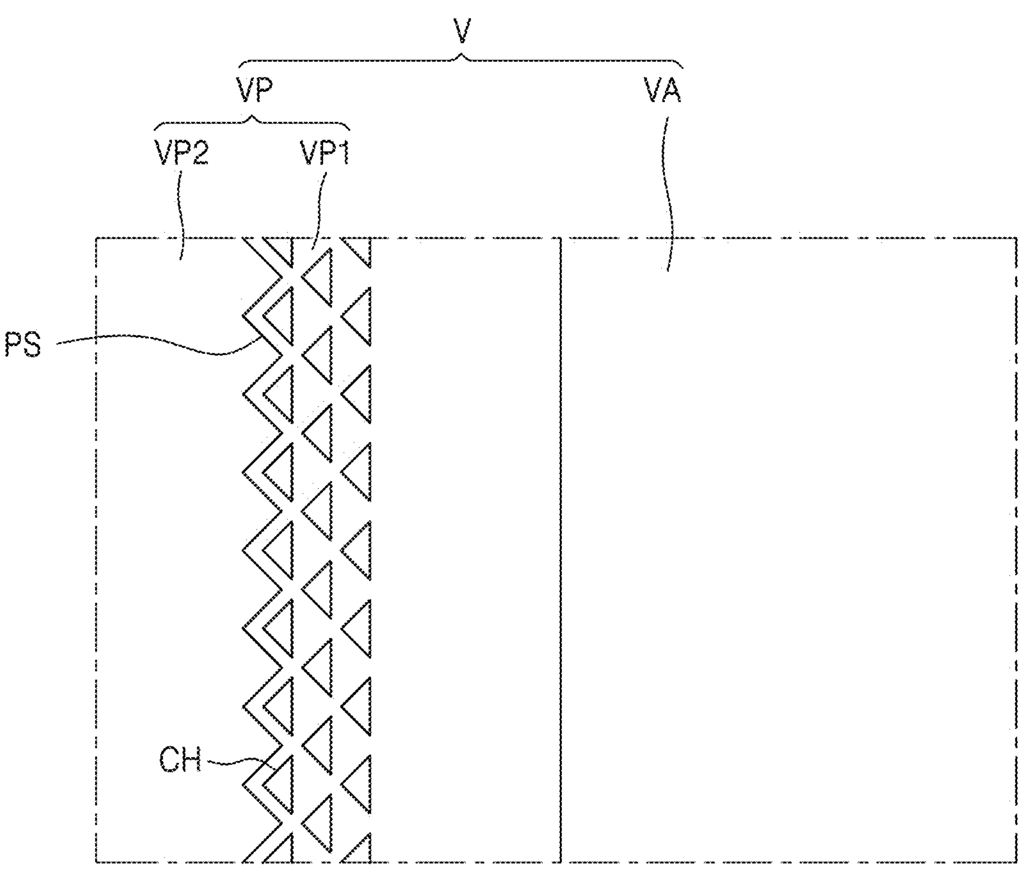
FIGS. 10A, 10B, 10C, and 10D are plan views schematically illustrating the valley portion shown in FIG. 6 according to another embodiment.
Figure 10A:
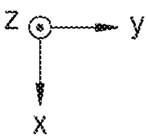
Figure 10B:
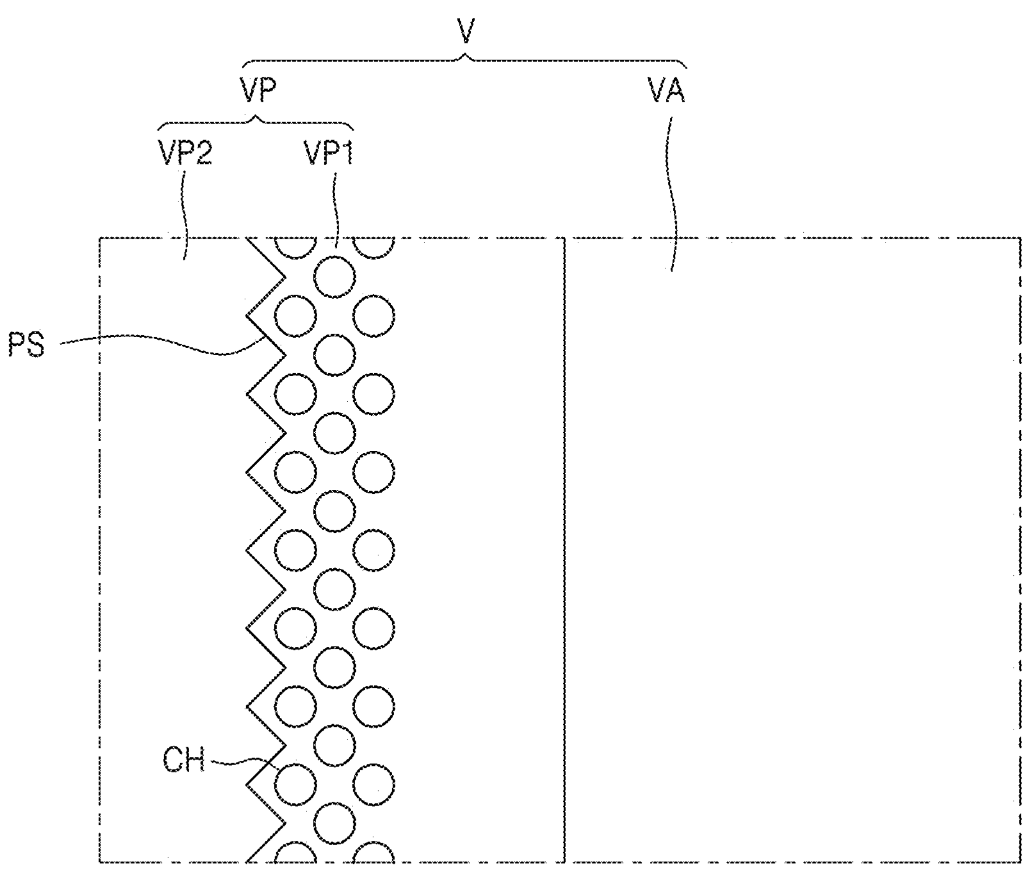
Figure 10B:
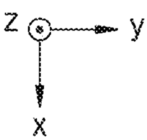
Figure 10C:
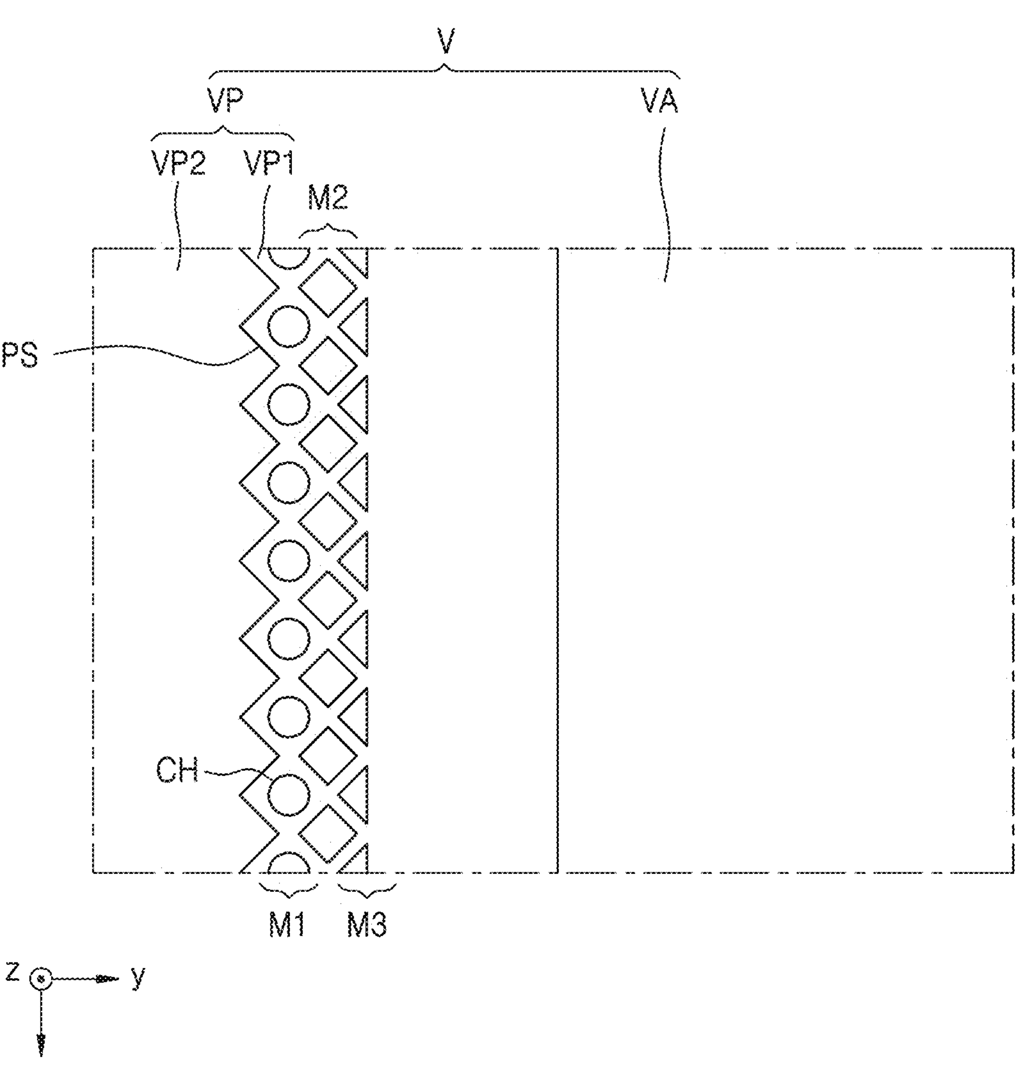

FIGS. 10A, 10B, and 10C are plan views schematically illustrating the valley portion V illustrated in FIG. 6 according to another embodiment.

Referring to FIGS. 7A and 10A, 10B, and 10C, the planar shape of the control hole CH may include various shapes.

For example, the planar shape of the control hole CH may be a polygon having four or more sides as shown in FIG. 7A. In another embodiment, the planar shape of the control hole CH may be a triangle as shown in FIG. 10A. Although FIG. 10A illustrates that the direction of a vertex of the triangle faces the second valley peak VP2, the disclosure is not limited thereto, and the direction of the vertex of the triangle may face the valley VA. In another embodiment, the planar shape of the control hole CH may be a circle as shown in FIG. 10B. In another embodiment, although not shown in the drawings, the planar shape of the control hole CH may include a portion of a circle, a portion of an oval, and/or a portion of a polygon. In another embodiment, the planar shape of the control hole CH may include an irregular shape, such as a star or a cross.

In another embodiment, the planar shapes of the plurality of control hole CH may be different from each other as shown in FIG. 10C. For example, the planar shapes of the control hole CH arranged in the first row M1, the control hole CH arranged in the second row M2, and the control hole CH arranged in the third row M3 may be different from each other. The planar shapes of the control holes CH arranged in a plurality of rows may approximate a circle in an outward direction. For example, the planar shape of the control hole CH arranged in the first row M1 may be a circle, the planar shape of the control hole CH arranged in the second row M2 may be a rhombus, and the planar shape of the control hole CH arranged in the third row M3 may be a triangle. Accordingly, the position of the end 320L of the organic encapsulation layer 320 may be precisely controlled.

Figure 10D:
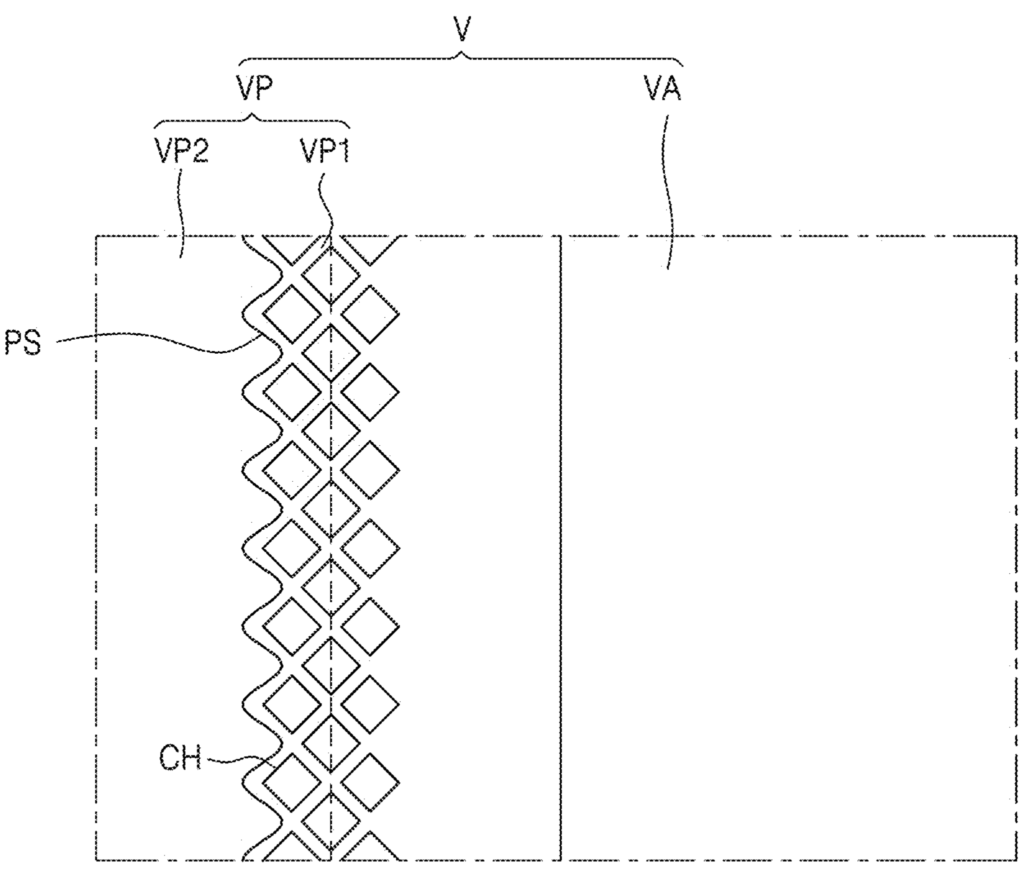
Figure 10D:
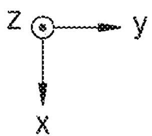

FIG. 10D is a plan view schematically illustrating the valley portion V illustrated in FIG. 6 according to another embodiment.

Referring to FIGS. 7A and 10D, the peak surface PS may have various shapes.

For example, the peak surface PS may include a sawtooth shape as shown in FIG. 7A, when viewed from above. In another embodiment, the peak surface PS may include a curved shape as shown in FIG. 10D, when viewed from above. In another embodiment, the peak surface PS may include at least two of a sawtooth shape, a curved shape, and a linear shape that is parallel to the x-axis, when viewed from above. In this structure, the area of the peak surface PS may increase.

In a display device according to embodiments of the disclosure, by precisely controlling the position of an end of an organic layer, a stripe or the like may be prevented from being visible. In addition, in the display device according to embodiments of the disclosure, by forming a highest point of the organic layer to be high when forming the organic layer, the height of the organic layer, which is arranged to correspond to a display area, may be maintained uniform.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A display device comprising:

a substrate;

a display portion disposed on the substrate; and a thin-film encapsulation layer disposed on the display portion and configured to shield the display portion and including an organic encapsulation layer, wherein the display portion includes a valley portion configured to control a flow of the organic encapsulation layer, and the valley portion includes:

a valley overlapping the organic encapsulation layer;

a valley peak of which at least a portion is higher than a lower surface of the valley wherein the valley peak includes:

a first valley peak; and a second valley peak of which at least a portion is formed to be higher than the first valley peak, wherein the second valley peak includes a peak surface having an uneven shape along a boundary with the first valley peak in a plan view; and at least one control hole configured to control a position of an end of the organic encapsulation layer such that the end of the organic encapsulation layer is disposed on the valley peak.

2. The display device of claim 1, wherein the at least one control hole is defined in the first valley peak.

3. The display device of claim 2, wherein the peak surface includes at least one sawtooth shape in a plan view.

4. The display device of claim 3, wherein at least a portion of the at least one control hole is defined in an area between edges of two adjacent sawtooth shapes of the at least one sawtooth shape.

5. The display device of claim 1, wherein a plurality of the control hole are provided, and in a plan view, the plurality of control holes are spaced apart from each other in at least one of a first direction and a second direction.

6. The display device of claim 5, wherein the first direction and the second direction are not perpendicular to each other.

7. The display device of claim 1, wherein the display portion includes:

a first insulating layer disposed on the substrate;

a second insulating layer disposed on the first insulating layer; and a pixel-defining layer disposed on the second insulating layer, wherein the pixel-defining layer is arranged in the valley, and the second insulating layer and the pixel-defining layer are arranged in the valley peak.

8. The display device of claim 7, wherein the second insulating layer is further arranged in the valley.

9. The display device of claim 1, wherein a spacer is arranged in the second valley peak.

10. The display device of claim 1, wherein the display portion includes:

a second insulating layer; and a pixel-defining layer disposed on the second insulating layer, and wherein the at least one control hole penetrates at least a portion of at least one of the second insulating layer and the pixel-defining layer.

11. A display device comprising:

a substrate including a display area and a non-display area;

a first insulating layer disposed on the substrate;

a second insulating layer disposed on the first insulating layer;

a pixel-defining layer disposed on the second insulating layer; and a thin-film encapsulation layer covering the pixel-defining layer and including an organic encapsulation layer, wherein a portion of at least one of the second insulating layer and the pixel-defining layer is recessed to accommodate the organic encapsulation layer, and the second insulating layer and the pixel-defining layer are arranged in the non-display area, at least one control hole is defined in an other portion of at least one of the second insulating layer and the pixel-defining layer, and the other portion is higher than the recessed portion of at least one of the second insulating layer and the pixel-defining layer, and the at least one control hole is configured to control a position of an end of the organic encapsulation layer wherein a planar shape of one control hole of the at least one control hole and a planar shape of an other one control hole of the at least one control hole are different from each other.

12. The display device of claim 11, wherein a cross-sectional shape of one control hole of the at least one control hole and a cross-sectional shape of an other one control hole of the at least one control hole are different from each other.

13. The display device of claim 11, wherein a planar shape of the at least one control hole comprises one of a polygon, a circle, and an oval.

14. The display device of claim 11, wherein a side surface of a cross-sectional shape of the at least one control hole is inclined.

15. The display device of claim 11, wherein a side surface of a cross-sectional shape of the at least one control hole is stepped.

16. The display device of claim 11, wherein the at least one control hole is formed in different layers in a depth direction.

17. The display device of claim 11, wherein a plurality of the control hole are provided, and in a plan view, the plurality of control holes are spaced apart from each other in a first direction and a second direction.

* * * * *